(12) United States Patent
Chuang et al.

(10) Patent No.: US 12,002,884 B2
(45) Date of Patent: Jun. 4, 2024

(54) DUAL GATE VERTICAL THIN FILM TRANSISTORS AND METHODS FOR FORMING THE SAME

(71) Applicant: Taiwan Semiconductor Manufacturing Company Limited, Hsinchu (TW)

(72) Inventors: Ming-Yen Chuang, Hsinchu (TW); Katherine H. Chiang, New Taipei (TW); Yun-Feng Kao, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 189 days.

(21) Appl. No.: 17/488,368

(22) Filed: Sep. 29, 2021

(65) Prior Publication Data
US 2023/0008902 A1    Jan. 12, 2023

Related U.S. Application Data

(60) Provisional application No. 63/219,649, filed on Jul. 8, 2021.

(51) Int. Cl.
*H01L 29/78* (2006.01)
*H01L 29/51* (2006.01)
*H01L 29/66* (2006.01)

(52) U.S. Cl.
CPC ........ *H01L 29/7827* (2013.01); *H01L 29/517* (2013.01); *H01L 29/66545* (2013.01); *H01L 29/66666* (2013.01)

(58) Field of Classification Search
CPC ............... H01L 29/7827; H01L 29/517; H01L 29/66545; H01L 29/66666; H01L 29/42364; H01L 29/78642; H01L 21/823871; H10B 53/00; H10B 53/30
USPC ......................................................... 257/330
See application file for complete search history.

(56) References Cited

U.S. PATENT DOCUMENTS

| | | | | |
|---|---|---|---|---|
| 7,868,374 | B2* | 1/2011 | Cheng ................. | H01L 29/7841 257/296 |
| 10,720,509 | B1* | 7/2020 | Liao .................... | H01L 29/4238 |
| 2004/0266112 | A1* | 12/2004 | Skotnicki ............ | H01L 29/7827 438/596 |
| 2009/0029513 | A1* | 1/2009 | Blanchard .......... | H01L 29/4238 438/269 |
| 2011/0121284 | A1* | 5/2011 | Yamazaki ......... | H01L 29/78606 257/43 |

(Continued)

*Primary Examiner* — Mohammad M Hoque
(74) *Attorney, Agent, or Firm* — The Marbury Law Group, PLLC

(57) ABSTRACT

A semiconductor structure includes vertical stacks located over a substrate, wherein each of the vertical stacks includes from bottom to top, a bottom electrode, a dielectric pillar structure including a lateral opening therethrough, and a top electrode; layer stacks located over the vertical stacks, wherein each of the layer stacks includes an active layer and an outer gate dielectric and laterally surrounds a respective one of the vertical stacks; inner gate electrodes passing through a respective subset of the lateral openings in a respective row of vertical stacks that are arranged along a first horizontal direction; and outer gate electrodes laterally extending along the first horizontal direction and laterally surrounding a respective row of layer stacks.

20 Claims, 29 Drawing Sheets

(56) References Cited

U.S. PATENT DOCUMENTS

| | | | |
|---|---|---|---|
| 2012/0217468 A1* | 8/2012 | Tekleab | B82Y 10/00 |
| | | | 438/270 |
| 2014/0008606 A1* | 1/2014 | Hussain | H01L 29/66484 |
| | | | 438/306 |
| 2016/0197099 A1* | 7/2016 | Sasaki | H01L 29/78645 |
| | | | 257/43 |
| 2018/0175213 A1* | 6/2018 | Colinge | H01L 29/78696 |
| 2018/0197988 A1* | 7/2018 | Ratnam | H01L 29/66666 |
| 2019/0067475 A1* | 2/2019 | Liu | H01L 29/267 |
| 2019/0214432 A1* | 7/2019 | Kim | H10N 50/01 |
| 2020/0006542 A1* | 1/2020 | Vasen | H01L 29/0676 |
| 2021/0343787 A1* | 11/2021 | Goto | H10B 63/30 |
| 2022/0102352 A1* | 3/2022 | Lee | H10B 12/315 |
| 2022/0254925 A1* | 8/2022 | Gardner | H01L 21/823807 |
| 2022/0310613 A1* | 9/2022 | Okajima | H01L 29/7869 |
| 2023/0238431 A1* | 7/2023 | Cheng | H01L 29/7831 |
| | | | 257/9 |

* cited by examiner

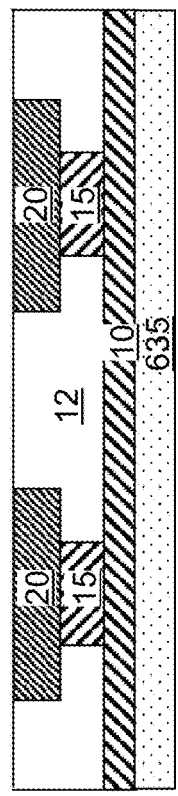
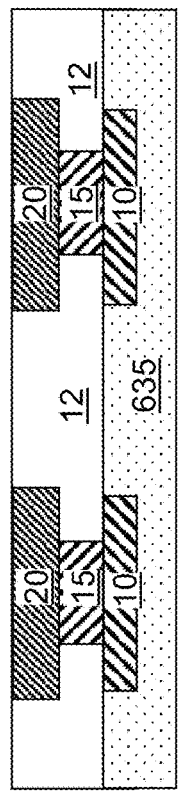
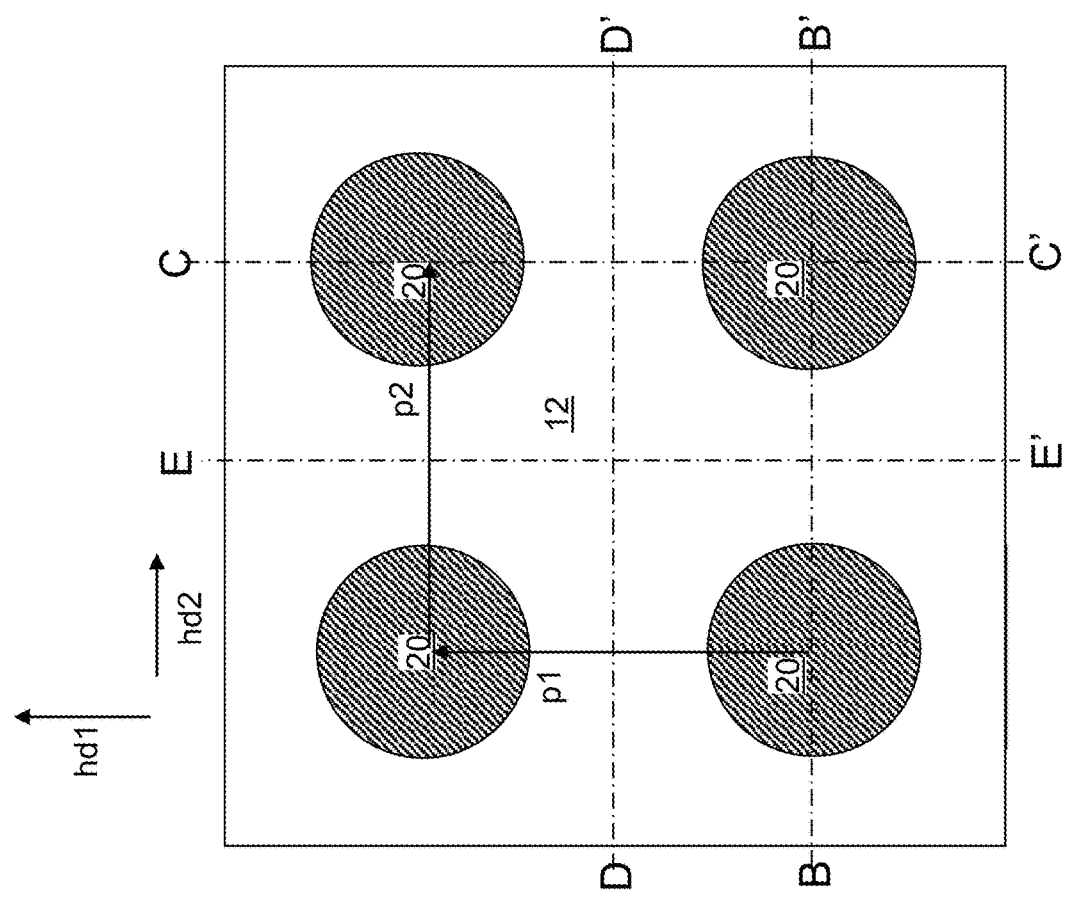
FIG. 3B
FIG. 3C
FIG. 3A

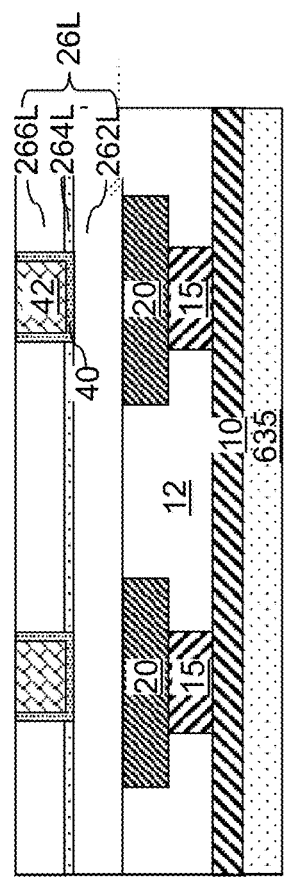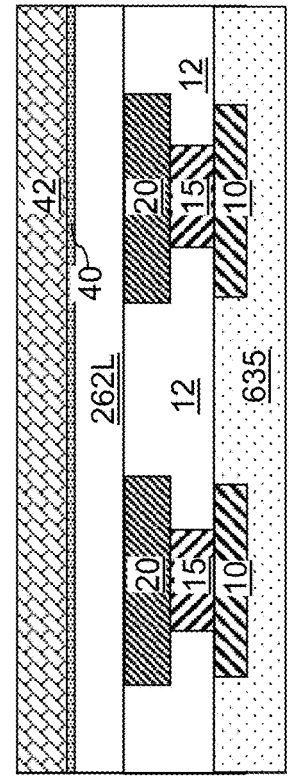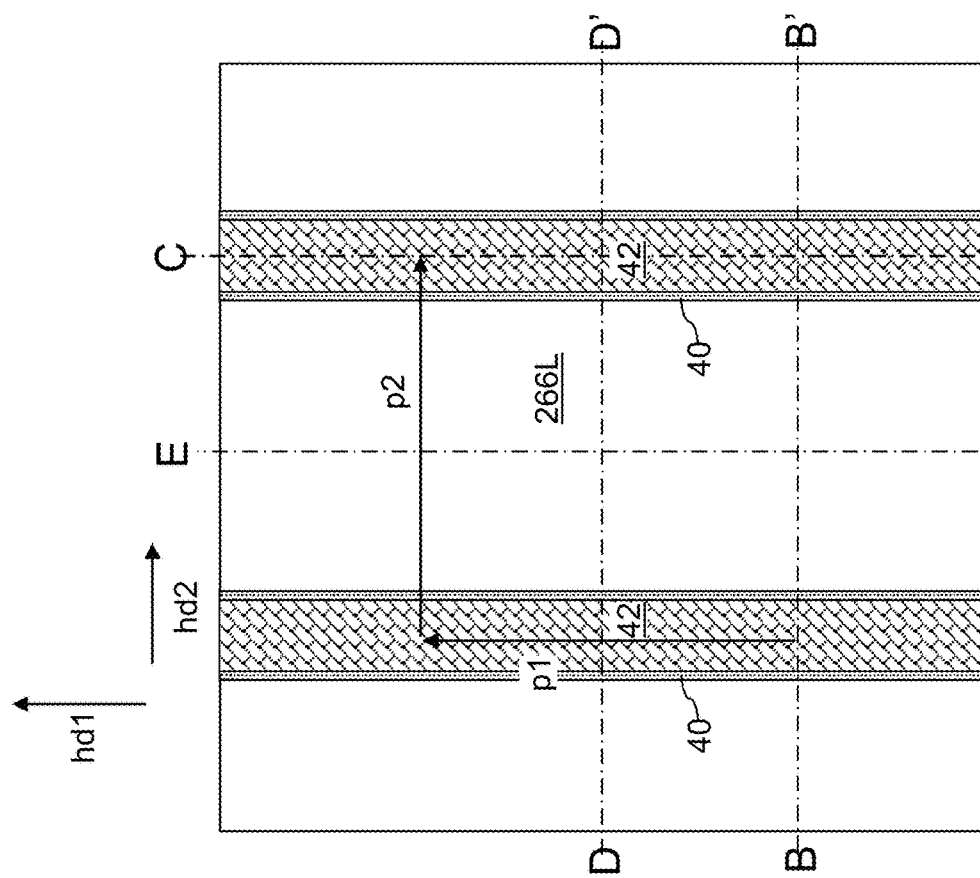

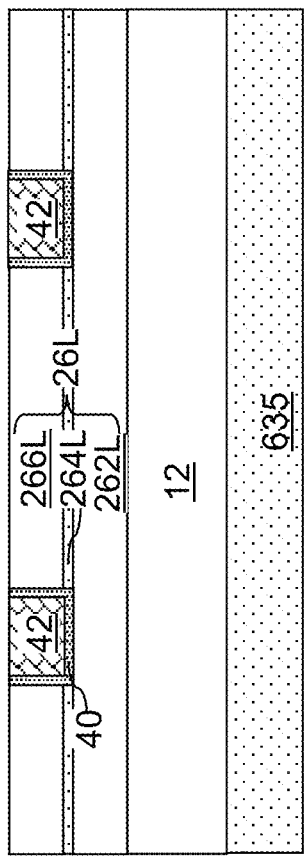
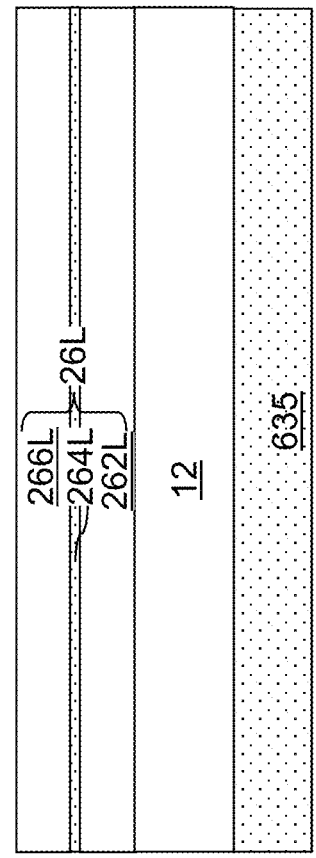

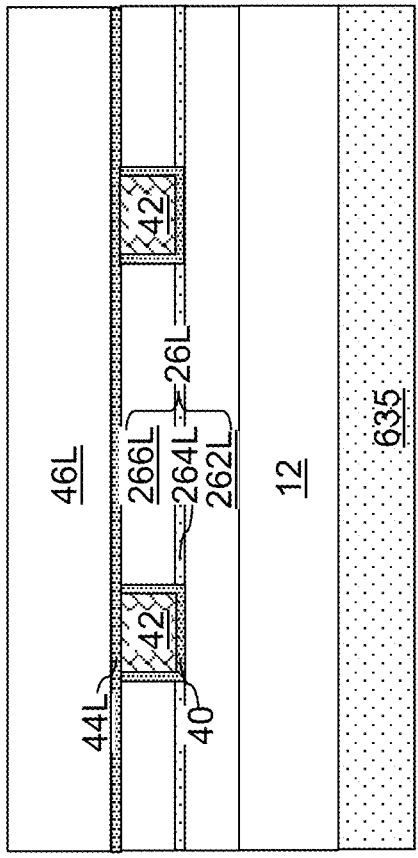
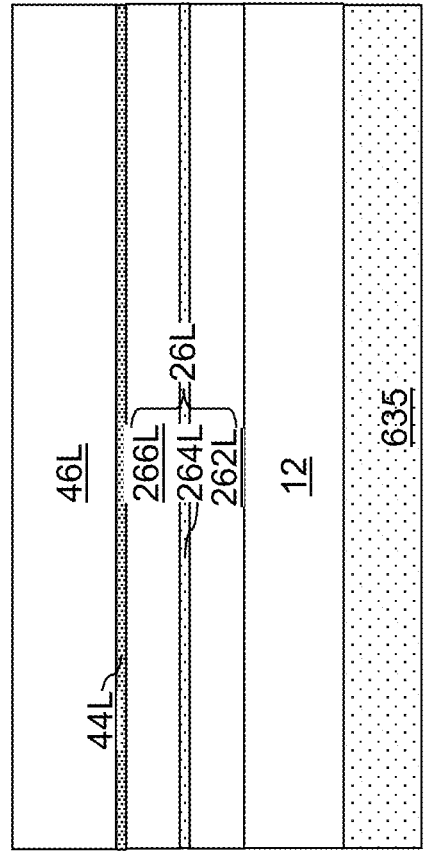
FIG. 5D
FIG. 5E

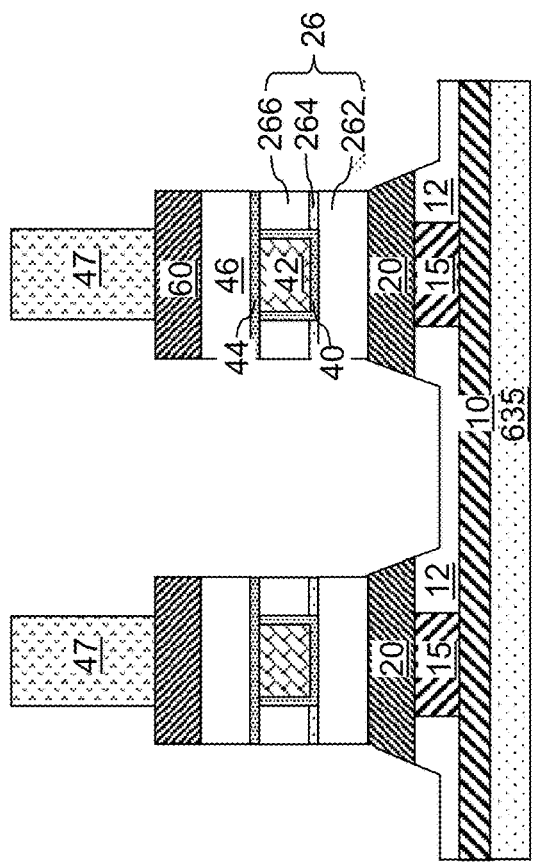
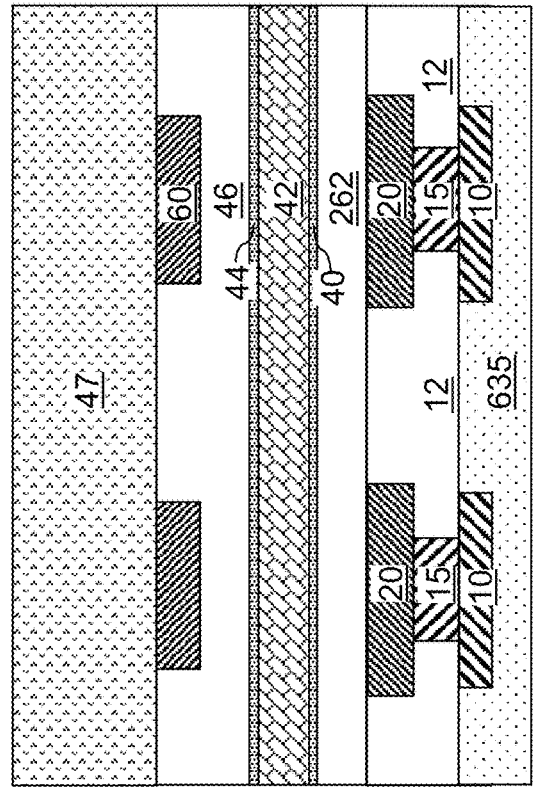
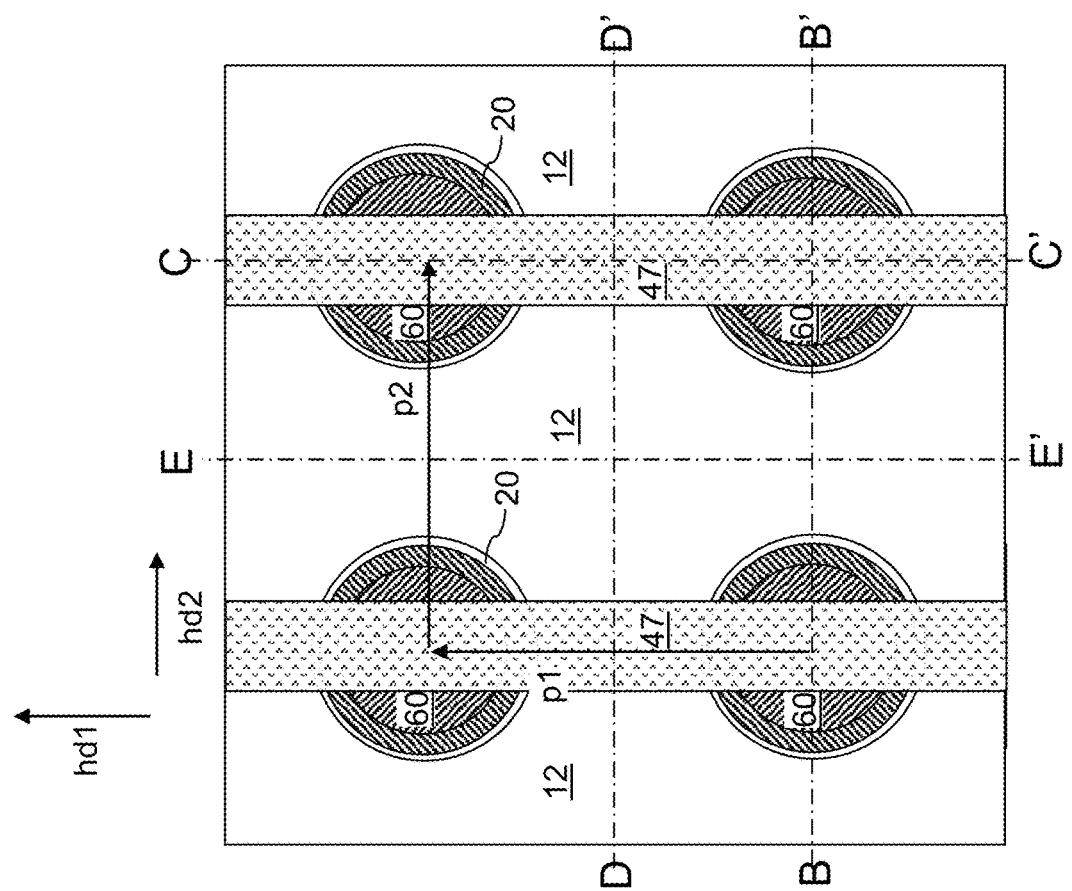
FIG. 6B
FIG. 6C
FIG. 6A

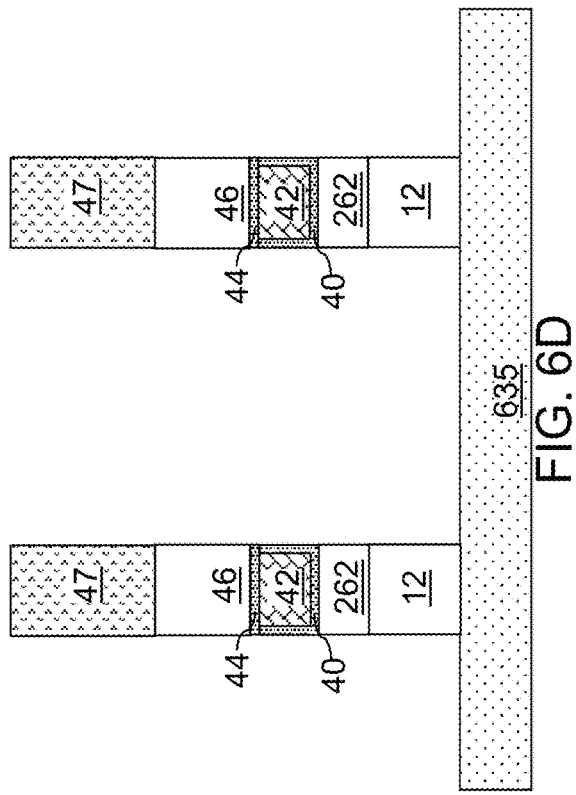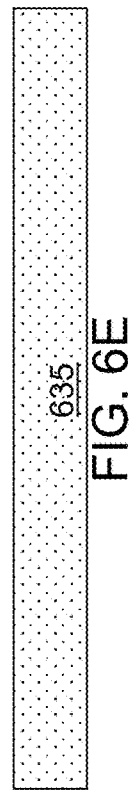

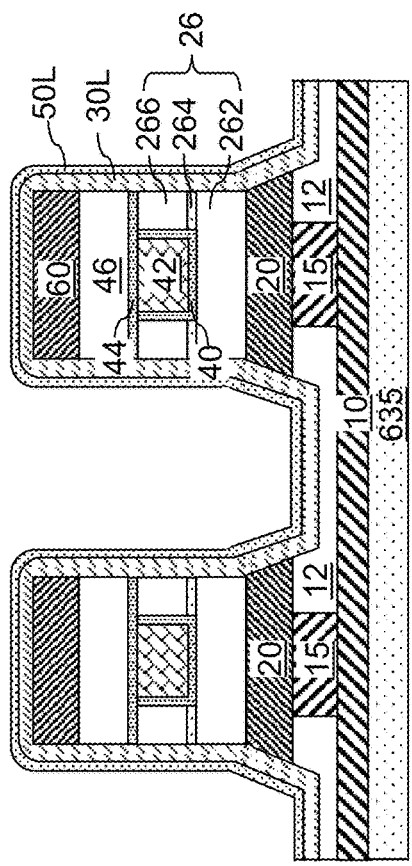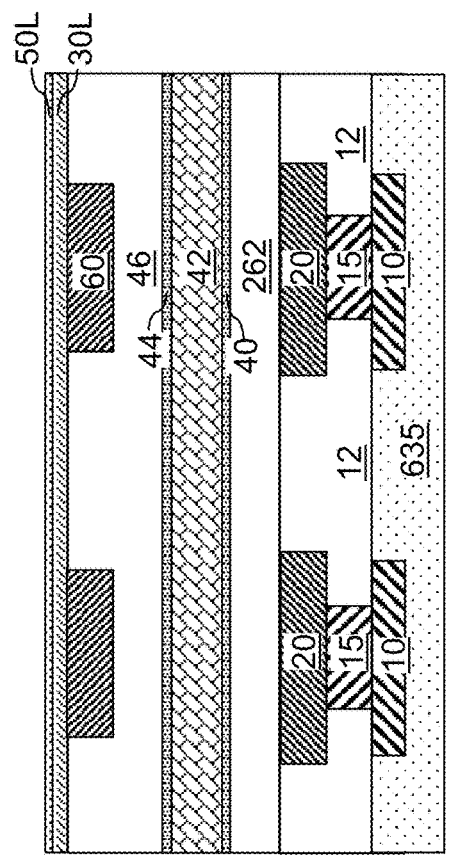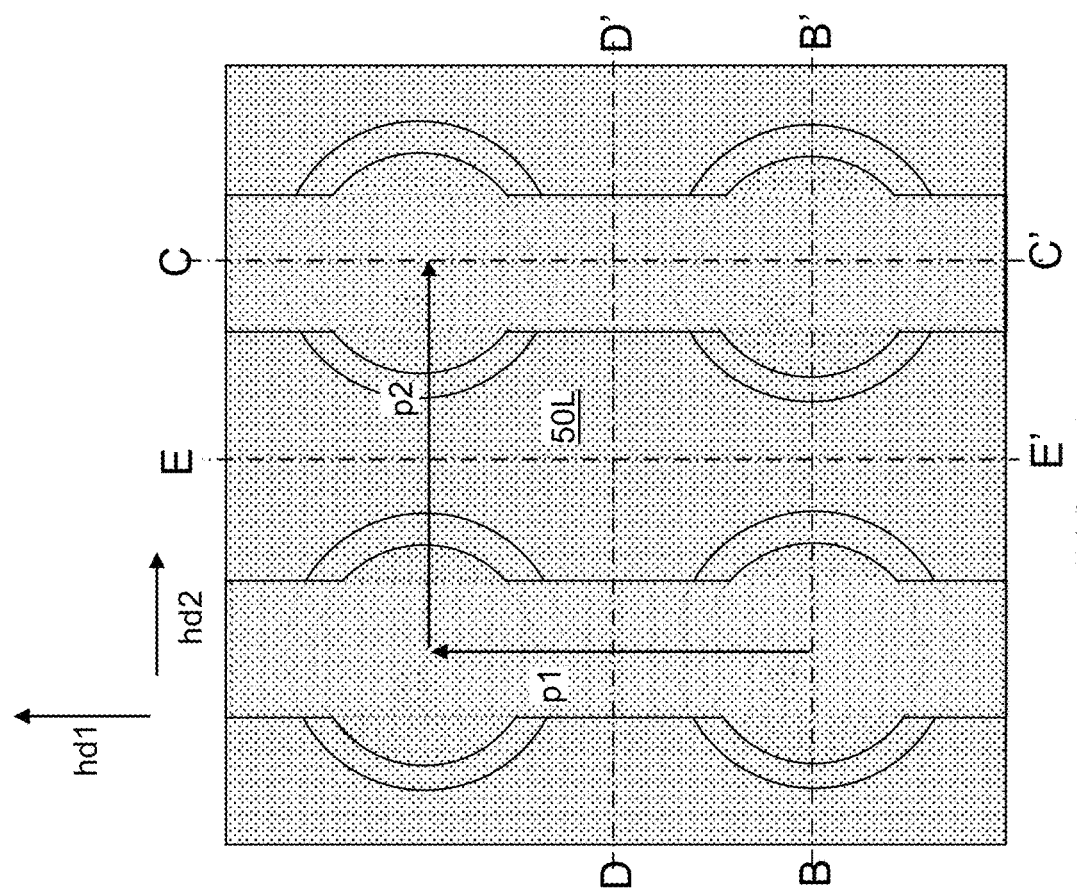

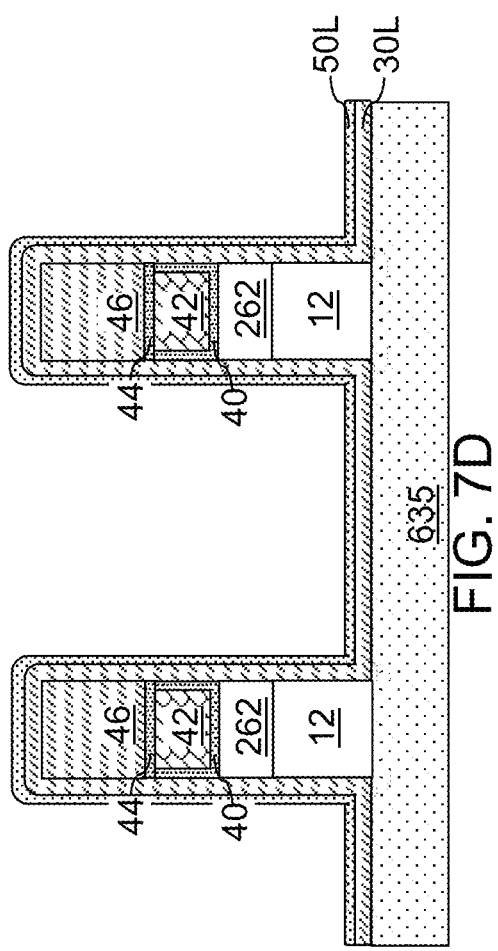
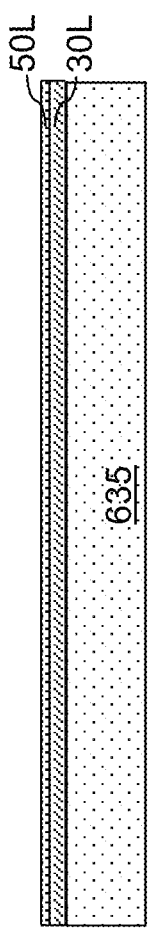

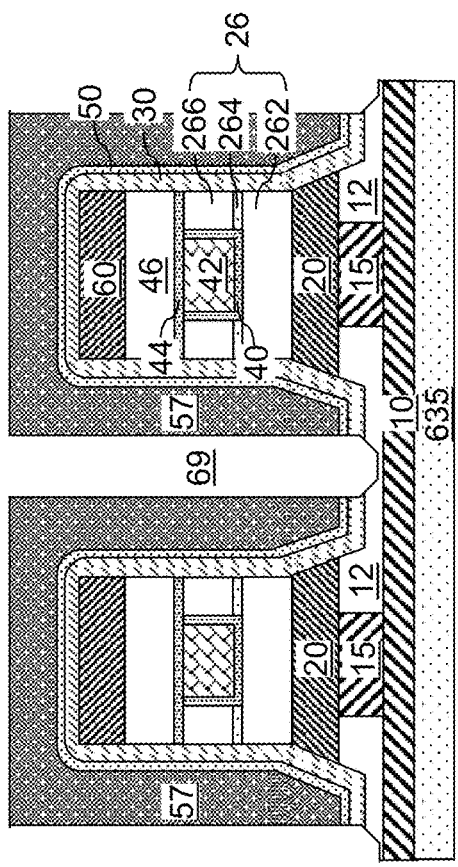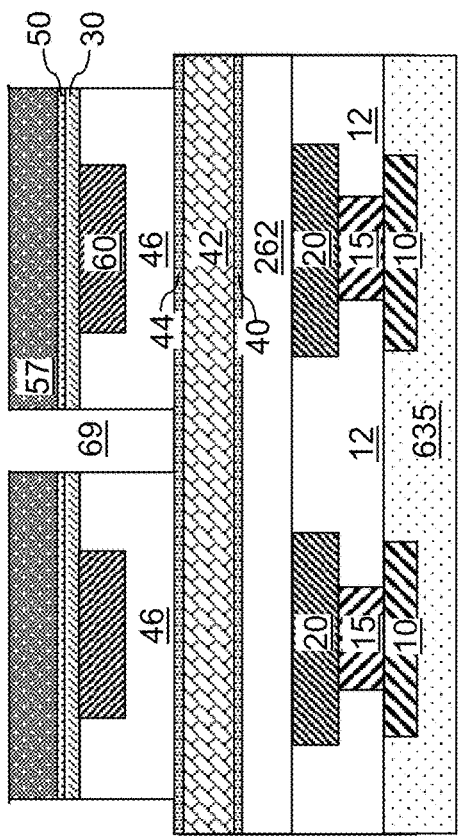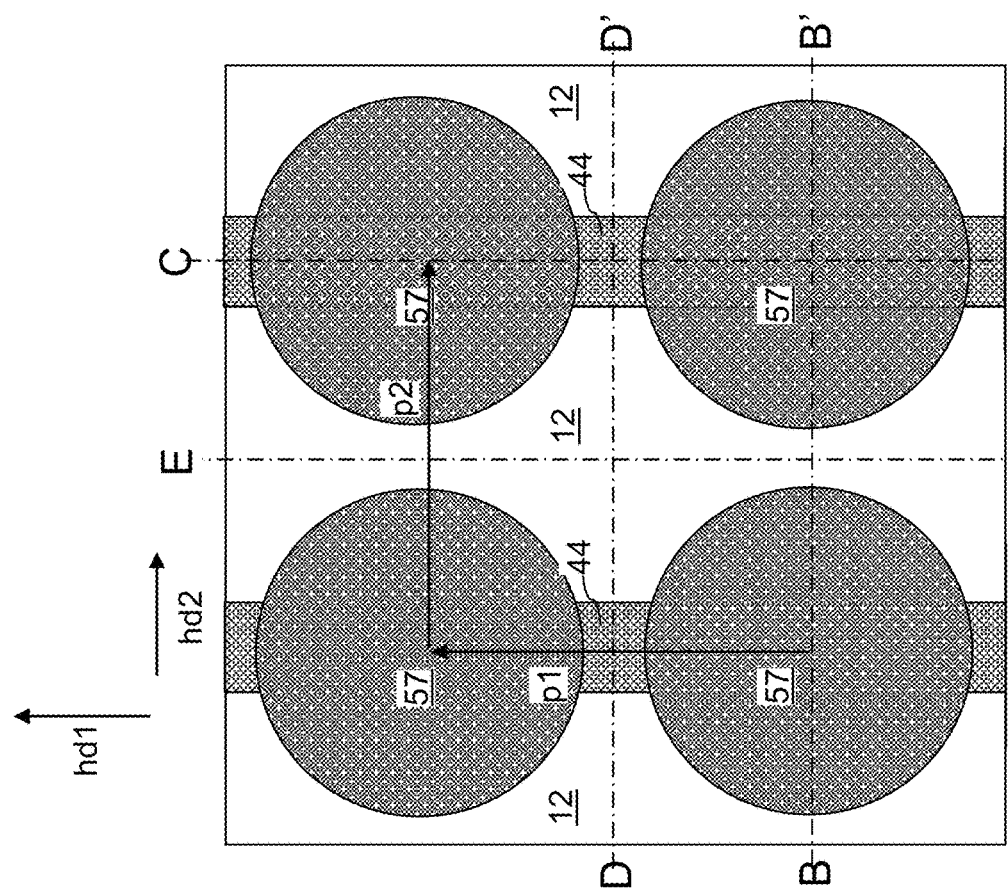
FIG. 8B
FIG. 8C
FIG. 8A

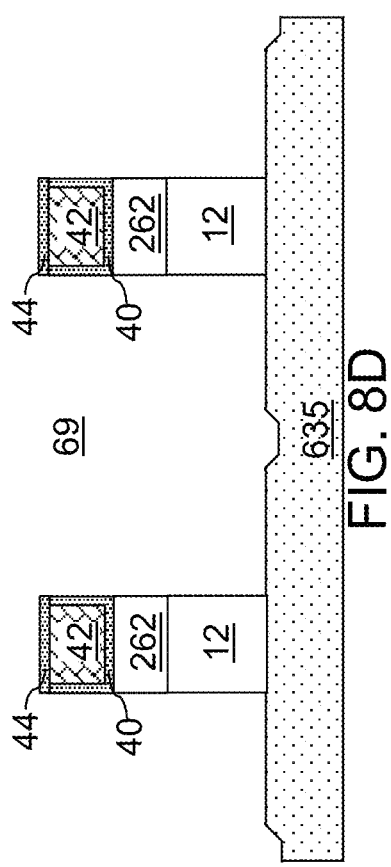
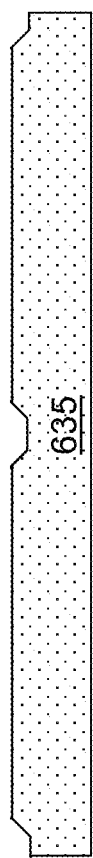

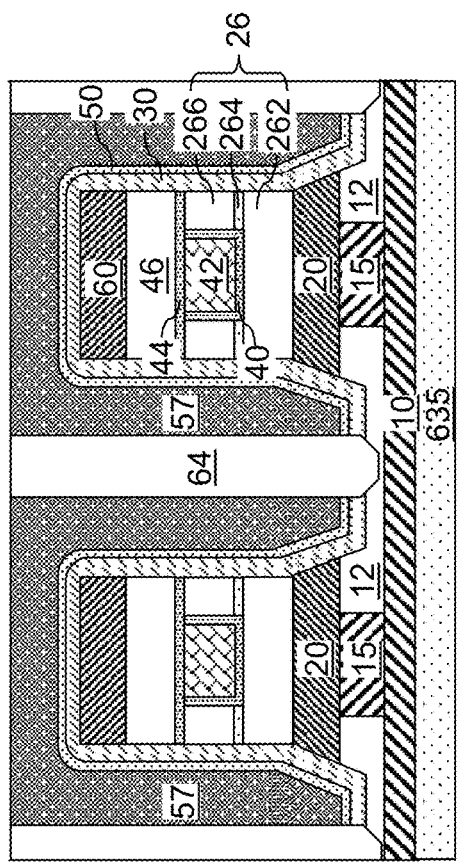
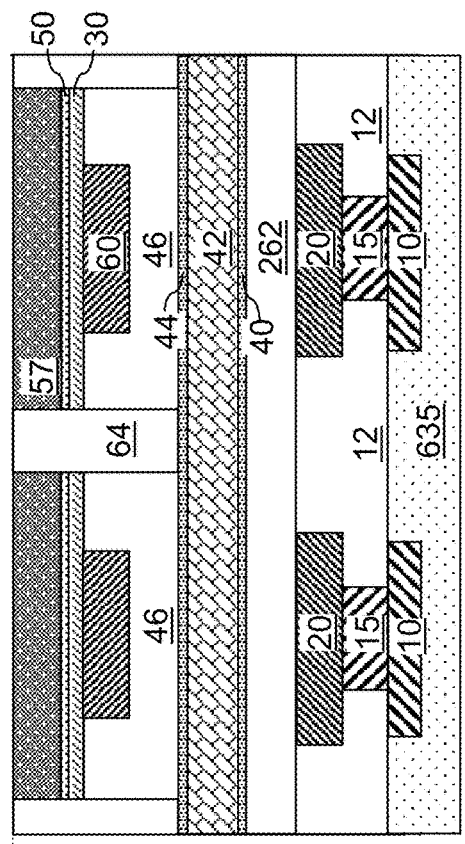
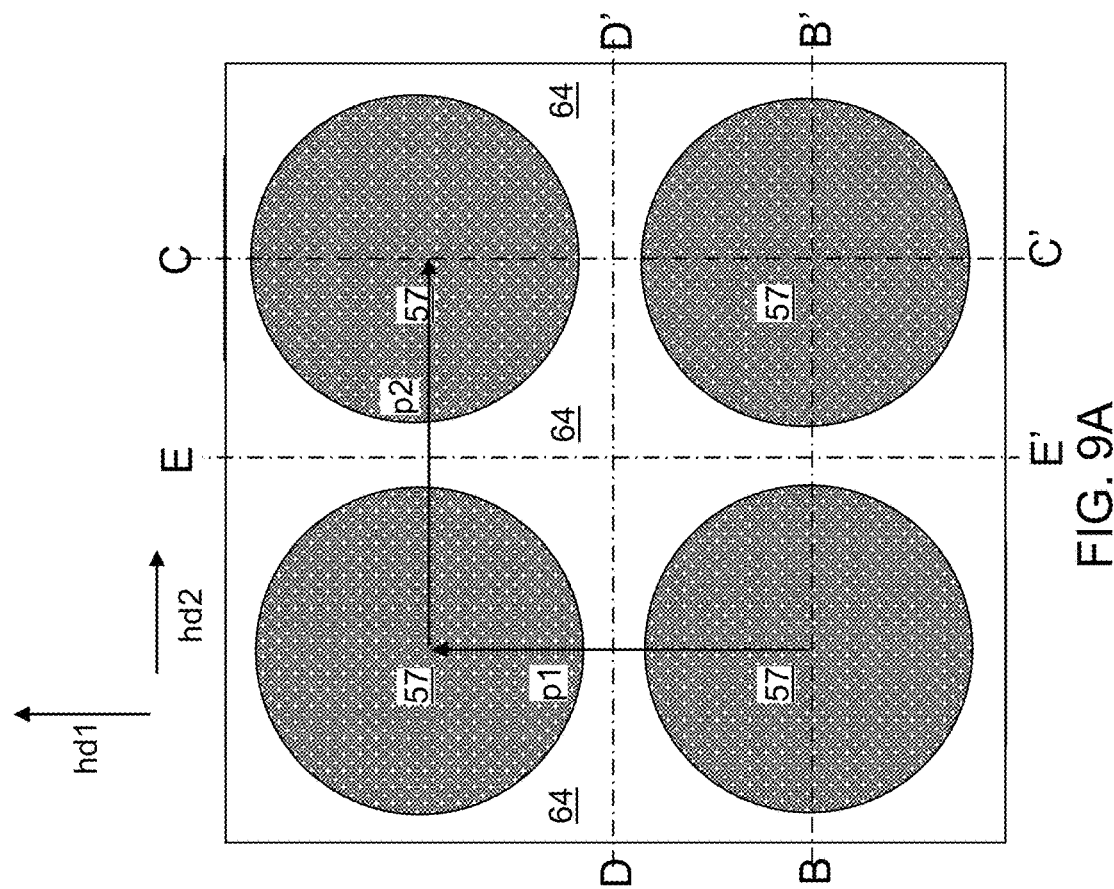
FIG. 9B
FIG. 9C
FIG. 9A

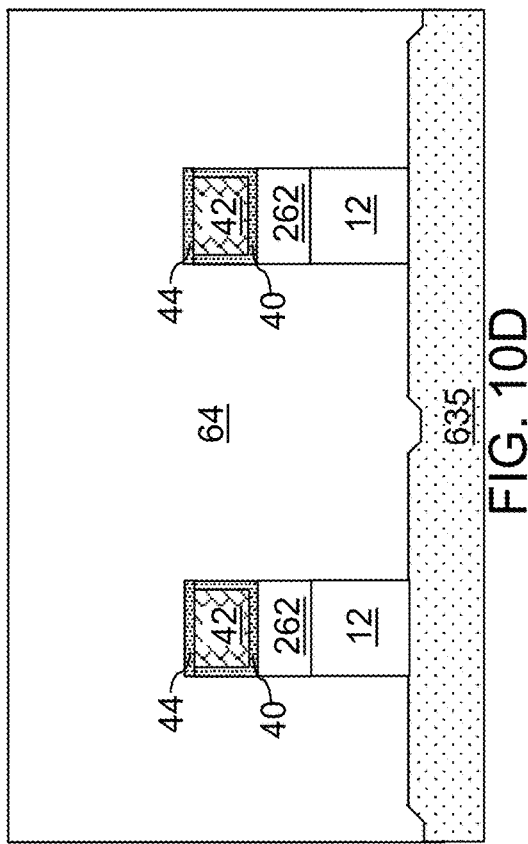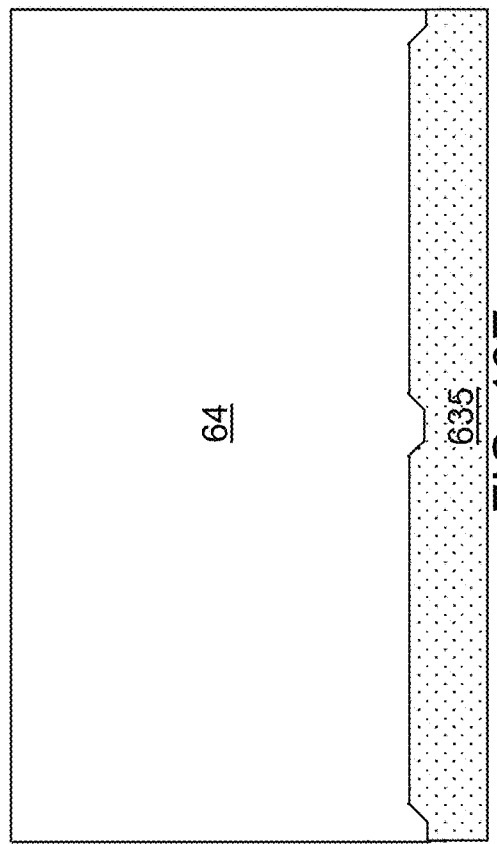

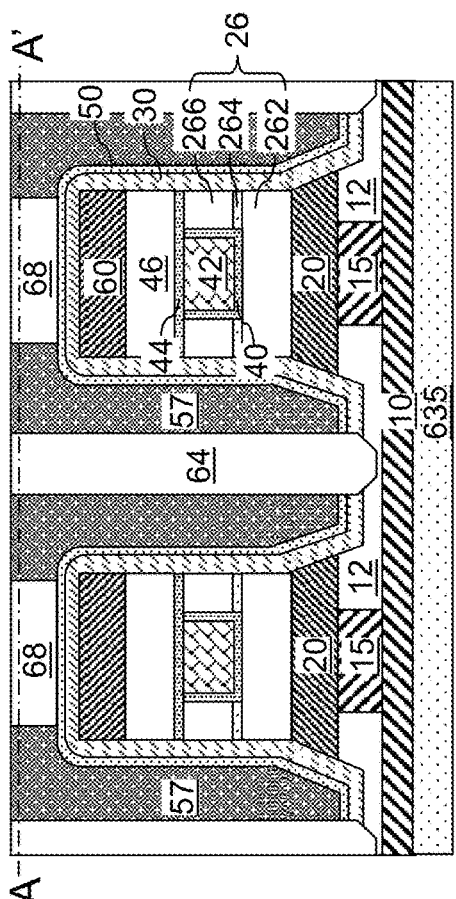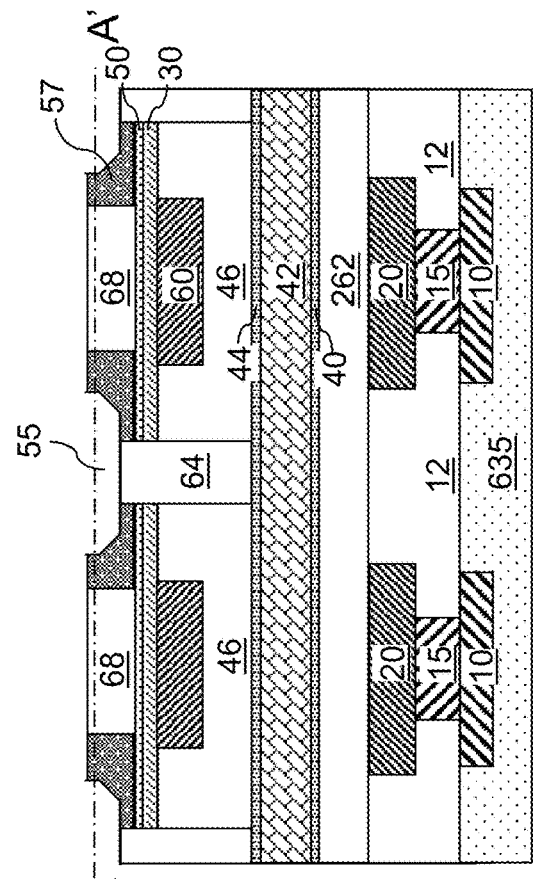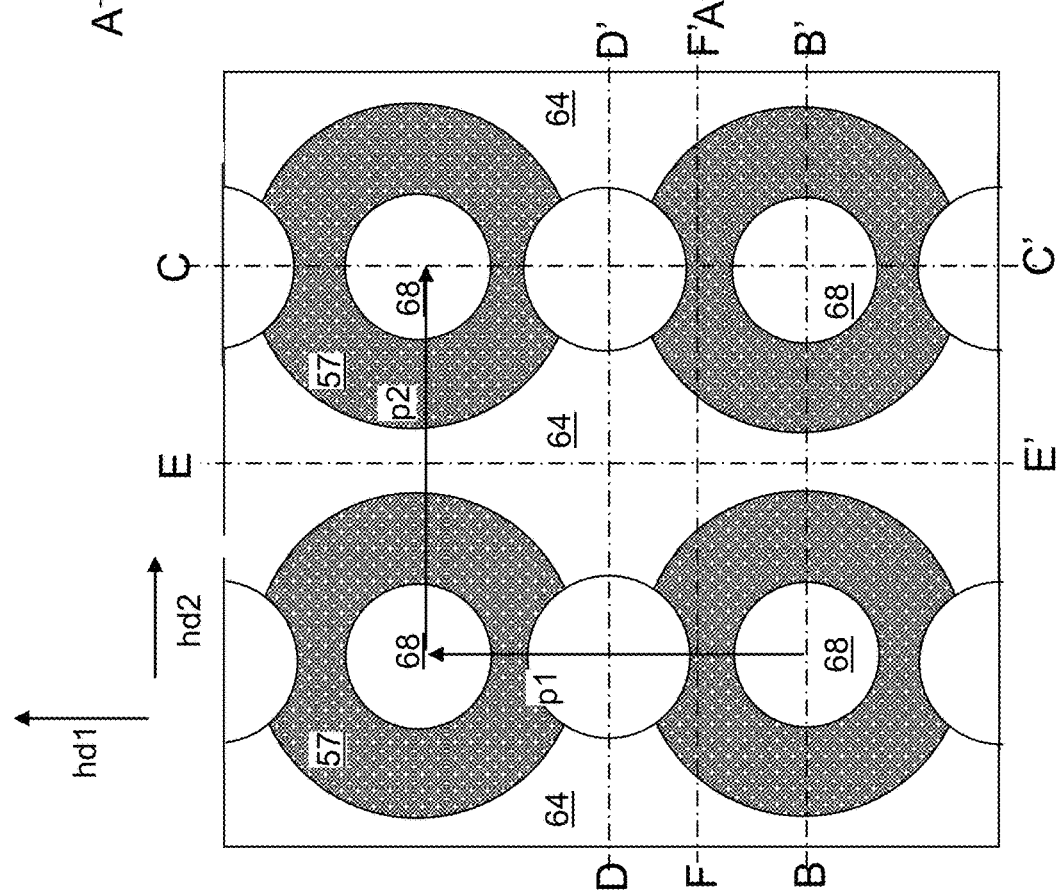
FIG. 11B
FIG. 11C
FIG. 11A

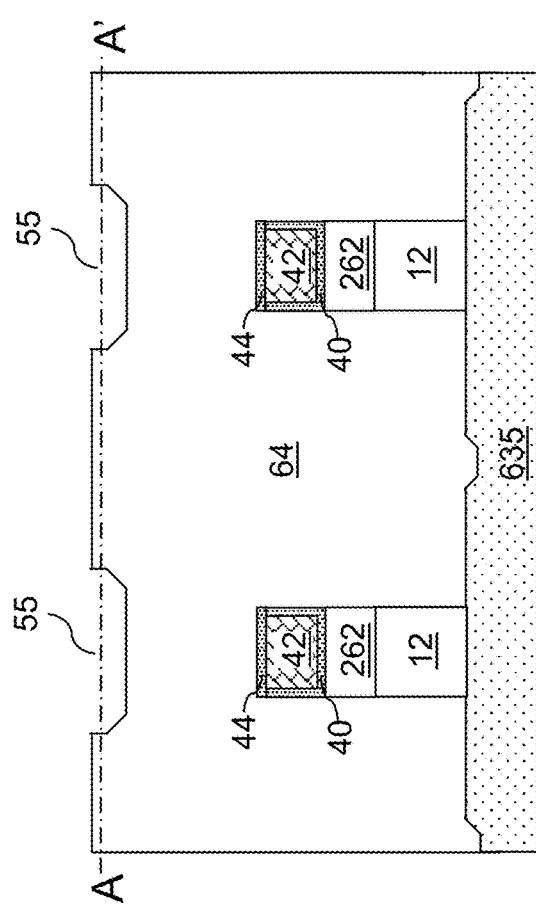
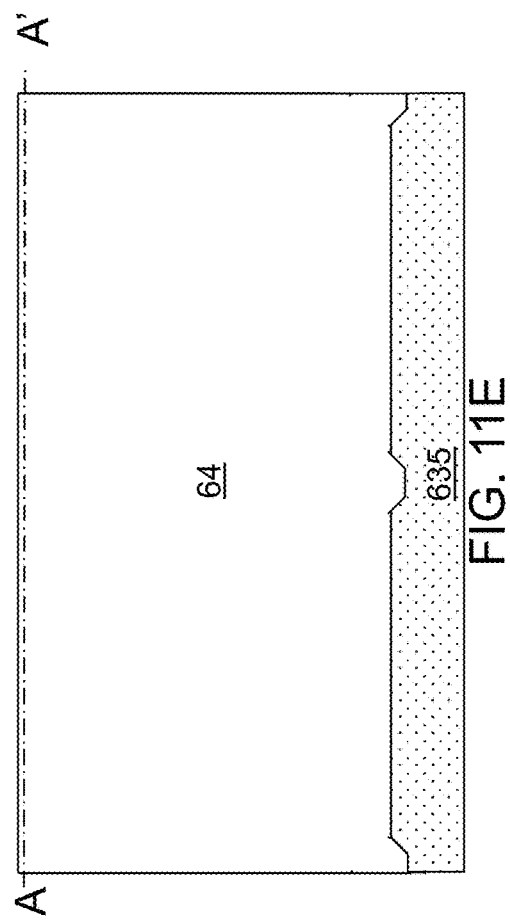
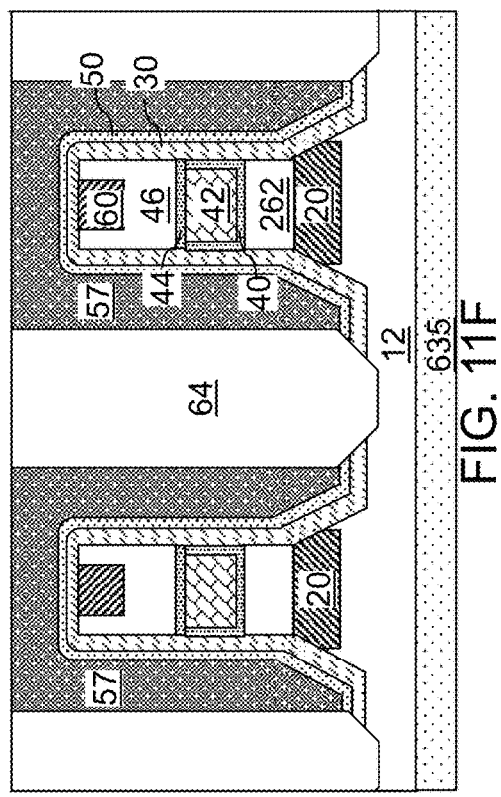

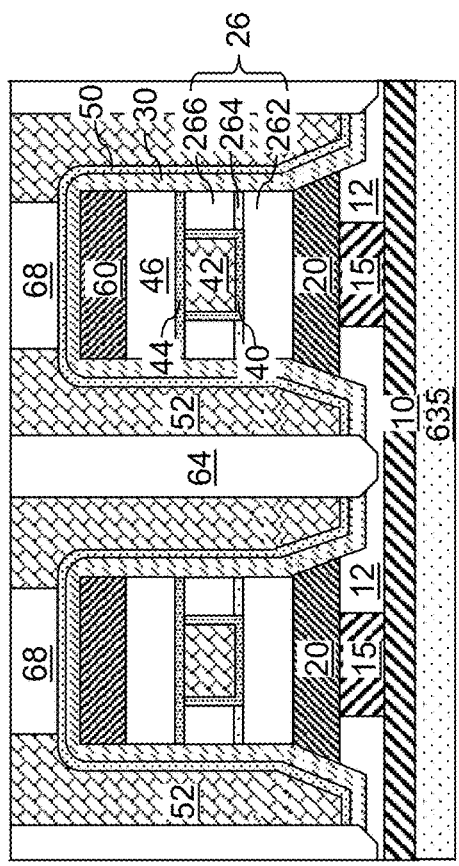
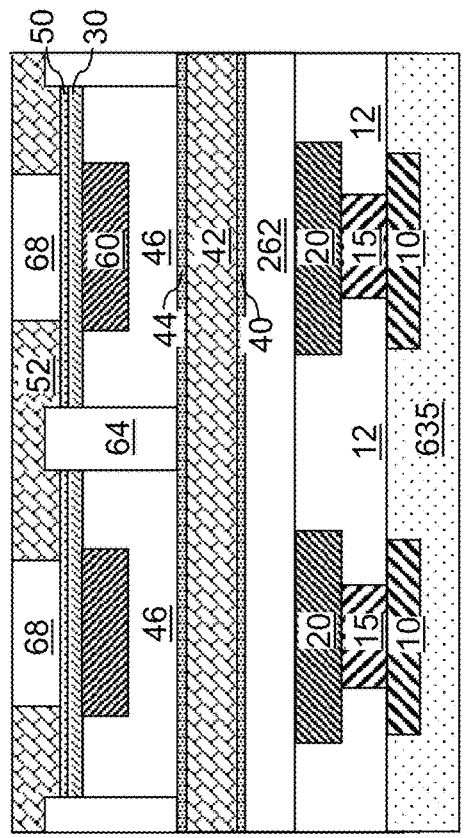
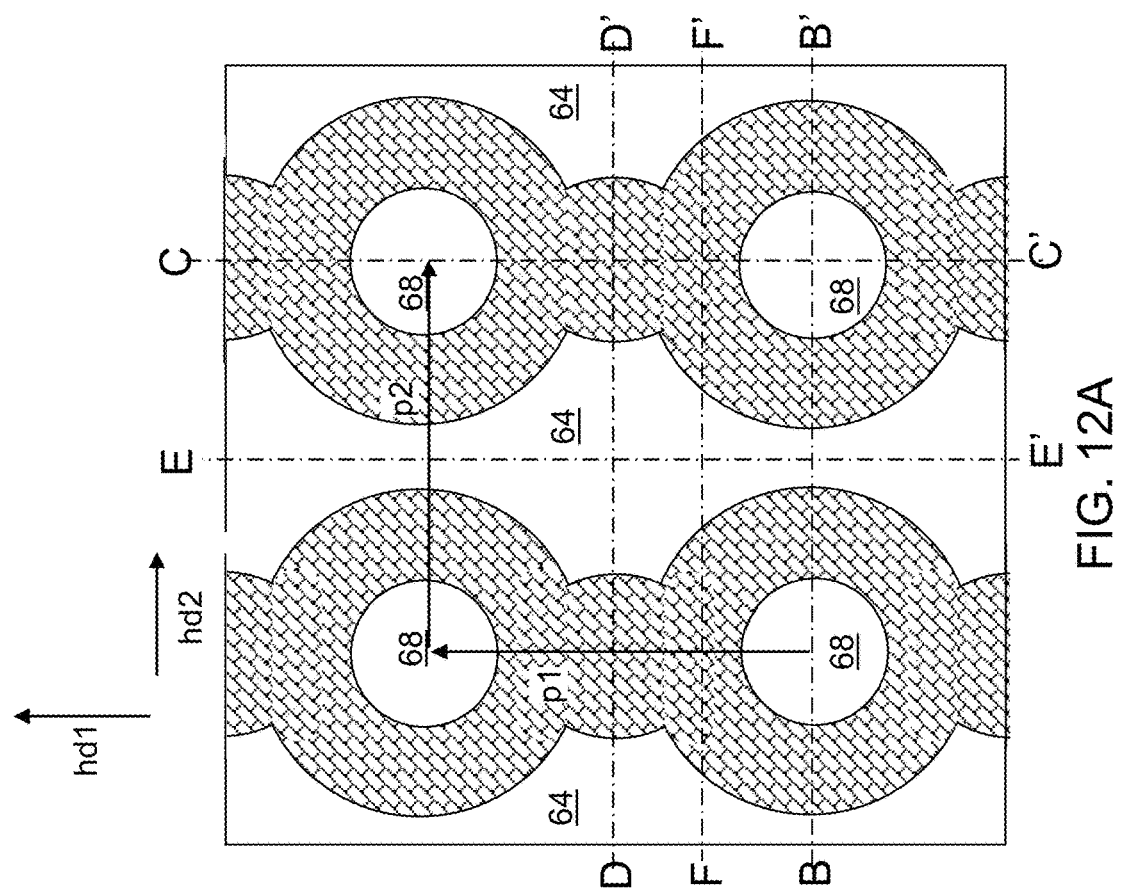
FIG. 12A
FIG. 12B
FIG. 12C

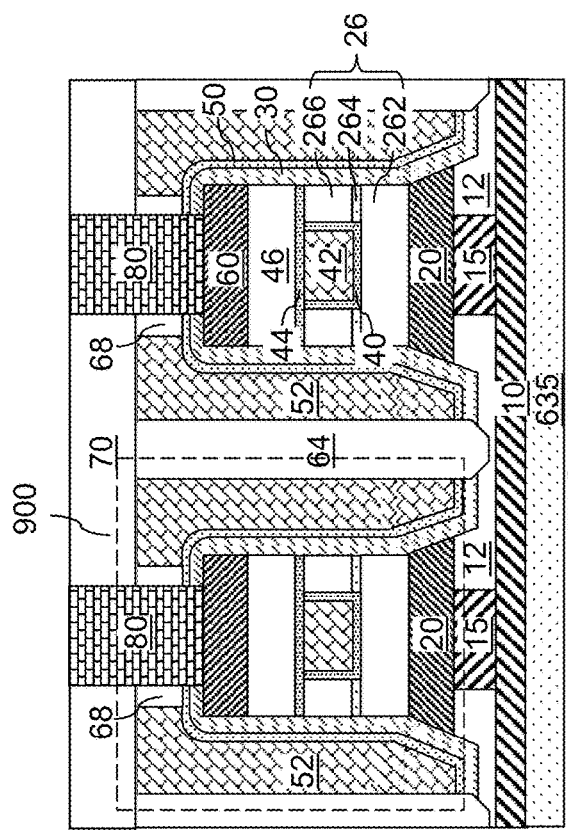
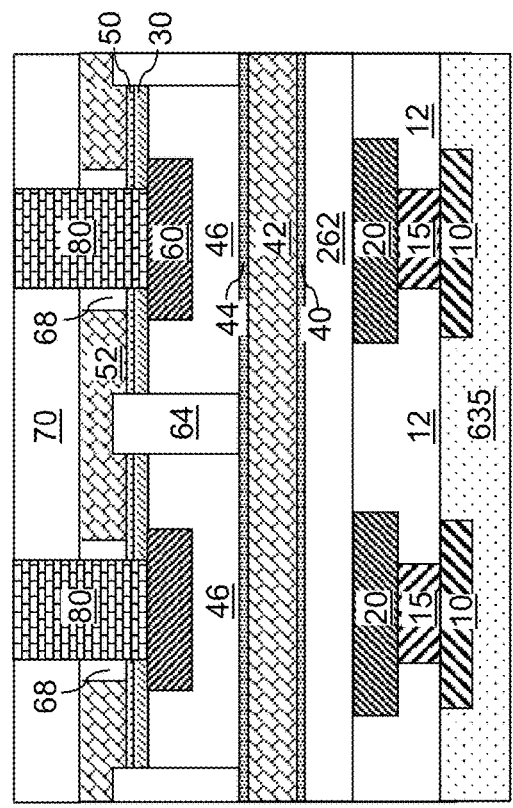
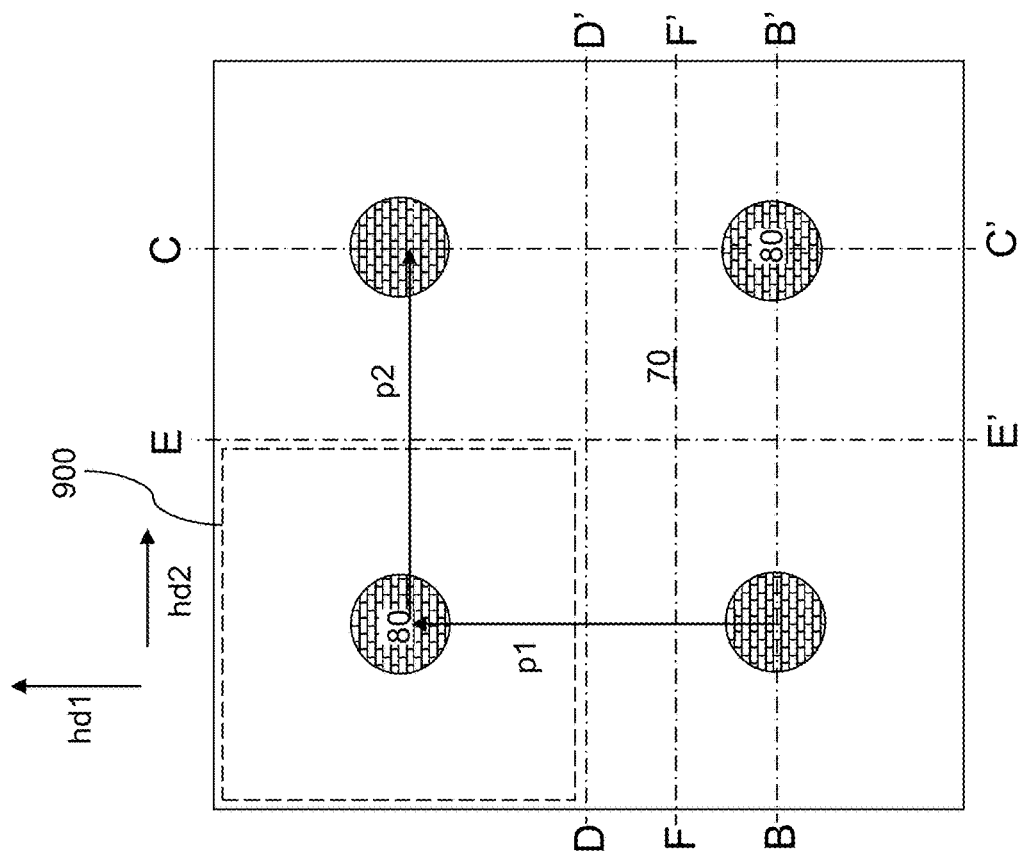
FIG. 13B
FIG. 13C
FIG. 13A

DUAL GATE VERTICAL THIN FILM TRANSISTORS AND METHODS FOR FORMING THE SAME

RELATED APPLICATIONS

This application claims the benefit of priority from a U.S. provisional application Ser. No. 63/219,649, titled "Sidewall Surrounded and Dual Gate Vertical Metal Oxide Thin Film Transistor Array," filed on Jul. 8, 2021, the entire contents of which are incorporated herein by reference.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

In figures labeled with a figure number and an alphabetical suffix, each set of figures with a same figure number corresponds to a same processing step. FIGS. 2A, 3A, 4A, 5A, 6A, 7A, 8A, 9A, 10A, 12A, and 13A are top-down views. FIG. 11A is a horizontal cross-sectional view along the horizontal plane A-A' in FIGS. 11B, 11C, 11D, 11E, and 11F. Each figure with the alphabetic suffix B is a vertical cross-sectional view along the plane B-B' of the figure with the same figure number and the alphabetic suffix "A." Each figure with the alphabetic suffix C is a vertical cross-sectional view along the plane C-C' of the figure with the same figure number and the alphabetic suffix "A." Each figure with the alphabetic suffix D is a vertical cross-sectional view along the plane D-D' of the figure with the same figure number and the alphabetic suffix "A." Each figure with the alphabetic suffix E is a vertical cross-sectional view along the plane E-E' of the figure with the same figure number and the alphabetic suffix "A." Each figure with the alphabetic suffix F is a vertical cross-sectional view along the plane F-F' of the figure with the same figure number and the alphabetic suffix "A."

FIGS. 2A, 2B, and 2C are various views of a portion of a memory array region of the exemplary structure after formation of bit lines in an insulating matrix layer according to a first embodiment of the present disclosure.

FIGS. 3A, 3B, 3C, 3D, and 3E are various views of a portion of a memory array region of the exemplary structure after formation of bottom contact via structures and bottom electrodes according to an embodiment of the present disclosure.

FIGS. 4A, 4B, 4C, 4D, and 4E are various views of a portion of a memory array region of the exemplary structure after formation of an inner-electrode-level dielectric layer, inner gate dielectrics, and inner gate electrodes according to an embodiment of the present disclosure.

FIGS. 5A, 5B, 5C, 5D, and 5E are various views of a portion of a memory array region of the exemplary structure after formation of a top-electrode-level dielectric layer and top electrodes according to an embodiment of the present disclosure.

FIGS. 6A, 6B, 6C, 6D, and 6E are various views of a portion of a memory array region of the exemplary structure after patterning the top-electrode-level dielectric layer, the inner-electrode-level dielectric layer, an inter-electrode dielectric layer, and a bottom-electrode-level dielectric layer according to an embodiment of the present disclosure.

FIGS. 7A, 7B, 7C, 7D, and 7E are various views of a portion of a memory array region of the exemplary structure after formation of a continuous active layer and an outer gate dielectric layer according to an embodiment of the present disclosure.

FIGS. 8A, 8B, 8C, 8D, and 8E are various views of a portion of a memory array region of the exemplary structure after formation of sacrificial material portions and isolation trenches according to an embodiment of the present disclosure.

FIGS. 9A, 9B, 9C, 9D, and 9E are various views of a portion of a memory array region of the exemplary structure after formation of a dielectric isolation matrix according to an embodiment of the present disclosure.

FIGS. 10A, 10B, 10C, 10D, and 10E are various views of a portion of a memory array region of the exemplary structure after formation of capping dielectric plates according to an embodiment of the present disclosure.

FIGS. 11A, 11B, 11C, 11D, 11E, and 11F are various views of a portion of a memory array region of the exemplary structure after formation of recess regions according to an embodiment of the present disclosure.

FIGS. 12A, 12B, 12C, 12D, 12E, and 12F are various views of a portion of a memory array region of the exemplary structure after formation of outer gate electrodes according to an embodiment of the present disclosure.

FIGS. 13A, 13B, 13C, 13D, 13E, and 13F are various views of a portion of a memory array region of the exemplary structure after formation of top contact via structures according to an embodiment of the present disclosure.

DETAILED DESCRIPTION

Figure 1:
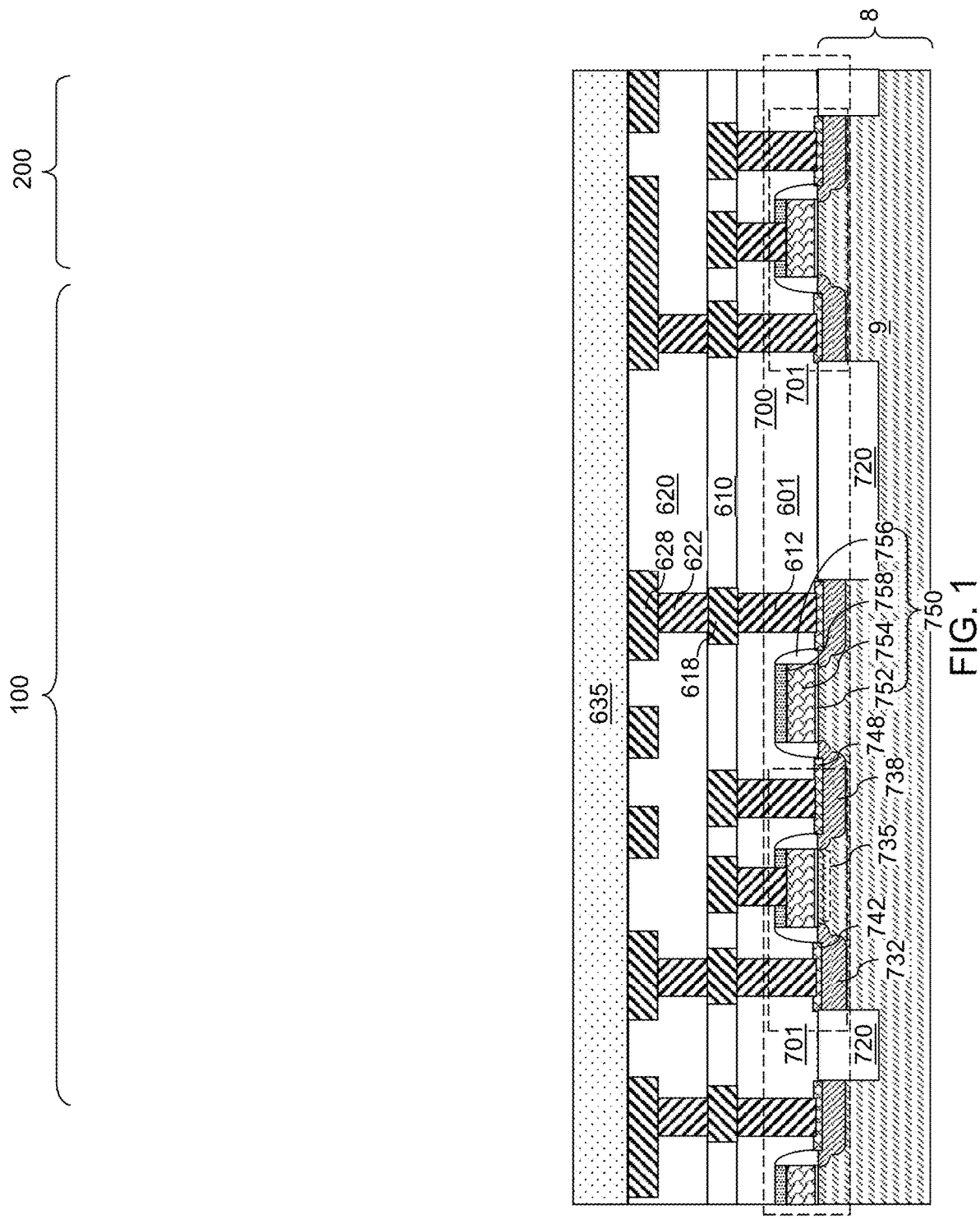
FIG. 1 is a vertical cross-sectional view of an exemplary structure after formation of complementary metal-oxide-semiconductor (CMOS) transistors, first metal interconnect structures formed in lower-level dielectric material layers, and an isolation dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Planar thin film transistors may be difficult to scale due to inherent limitations on material properties and due to the difficulty of process control in patterning small dimensions. While vertical device structures have been proposed to overcome the limitations of planar devices, such vertical devices typically suffer from insufficient source/drain-to-gate overlap, which adversely impacts device performance. Typically, the channel thickness is defined and restricted by the source metal, which degrades device control at the center of a channel region.

Generally, the structures and methods of the present disclosure may be used to form a semiconductor structure including vertical field effect transistors, which may include a two-dimensional array of vertical transistors (e.g., vertical thin film transistors). Each vertical transistor may be formed in a dual gate configuration including an inner gate electrode and an outer gate electrode. The inner gate electrode may be embedded in a dielectric pillar located between a bottom electrode and a top electrode. An active layer and an outer gate dielectric may be formed over a vertical stack of the bottom electrode, the dielectric pillar, and the top electrode. An outer gate electrode may be formed above the outer gate dielectric. The dual gate configuration may provide a greater channel width per device area and increased on-current per device area than typical channel designs.

Referring to FIG. 1, an exemplary structure according to a first embodiment of the present disclosure is illustrated. The exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The exemplary structure may include a memory array region 100 in which an array of memory cells may be subsequently formed. The exemplary structure may further include a peripheral region 200 in which metal wiring for the array of memory devices is provided. Generally, the field effect transistors 701 in the CMOS circuitry 700 may be electrically connected to an electrode of a respective memory cell by a respective set of metal interconnect structures.

Devices (such as field effect transistors 701) in the peripheral region 200 may provide functions that operate the array of memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective memory cell to be subsequently formed.

In one embodiment, the CMOS circuitry 700 may include a programming control circuit configured to control gate voltages of a set of field effect transistors 701 that are used for programming a respective memory cell and to control gate voltages of access transistors (e.g., thin film transistors) to be subsequently formed. For example, the respective memory cell may be a ferroelectric memory cell that uses a ferroelectric material as a dielectric material in the memory cell. In this embodiment, the programming control circuit may be configured to provide a first programming pulse that programs a respective dielectric material layer (e.g. ferroelectric material) in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from $1.0$ S/cm to $1.0 \times 10^{5}$ S/cm upon suitable doping with an electrical dopant.

According to embodiments of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contact a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplated herein in which the array of memory cells may be formed at a different metal interconnect level.

An array of transistors and an array of memory cells, such as thin-film transistors and ferroelectric memory cells, may be subsequently deposited over the dielectric material layers (601, 610, 620) that have formed therein the metal interconnect structures (612, 618, 622, 628). The set of all dielectric material layer that are formed prior to formation of an array of transistors and an array of memory cells, such as thin-film transistors and ferroelectric memory cells, is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, transistors, such as thin film transistors (TFTs), may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an insulating matrix layer 635. The insulating matrix layer 635 includes a dielectric material such as undoped silicate glass, a doped silicate glass, organosilicate glass, or a porous dielectric material, and may be deposited by chemical vapor deposition. The thickness of the insulating matrix layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The insulating matrix layer 635 may be formed over the interconnect-level dielectric layers.

Figure 2B:
Figure 2C:
Figure 2A:
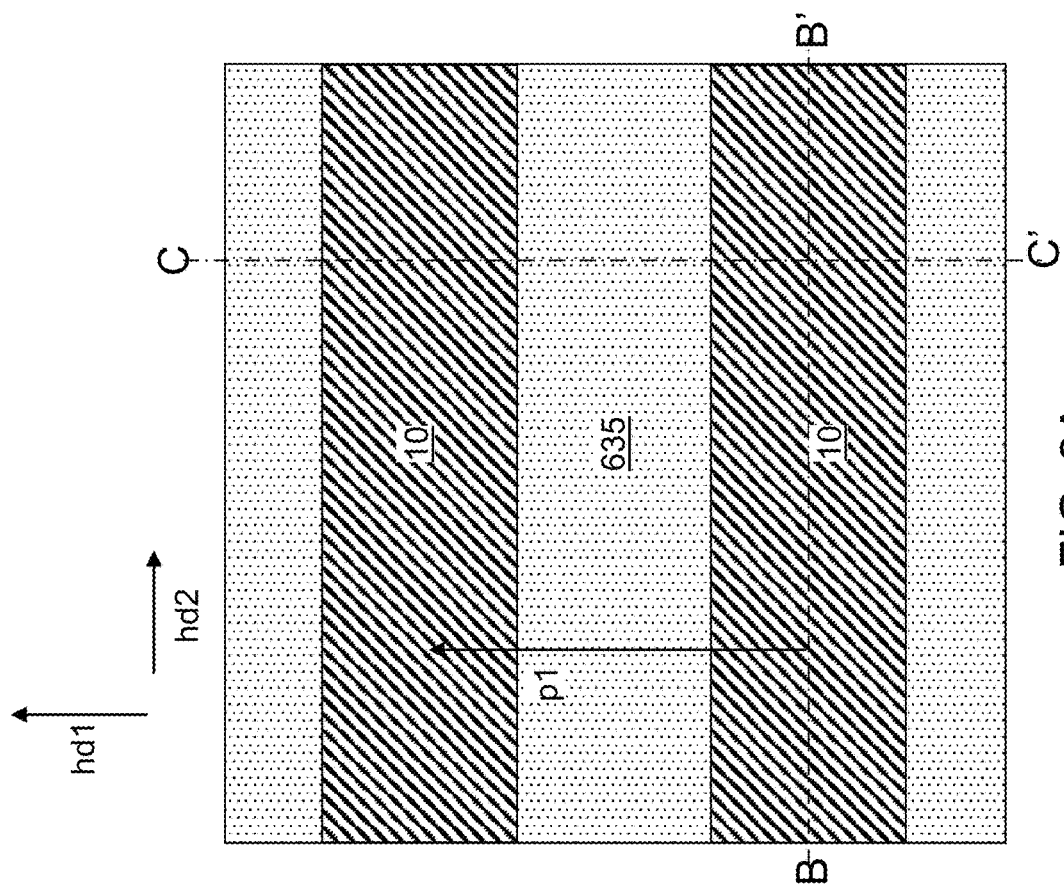
Figure 3D:
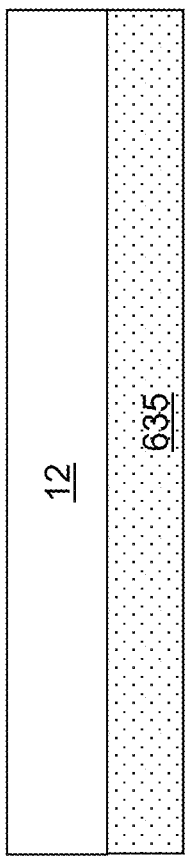
Figure 3E:
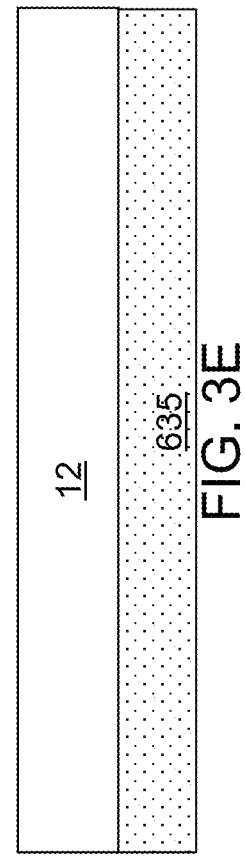

Referring to FIGS. 2A-2C, a portion of a memory array region 100 of the exemplary structure is illustrated after formation of bit lines 10 in the insulating matrix layer 635 according to a first embodiment of the present disclosure. The illustrated portion of the memory array region 100 corresponds to an area for forming four vertical field effect transistors. While the present disclosure is described using illustrations of an area for forming four vertical field effect transistors, the illustrated structure may be repeated along a first horizontal direction hd1 and along a second horizontal direction hd2 that is perpendicular to the first horizontal direction hd1 to provide a two-dimensional array of vertical field effect transistors containing more than four field effect transistors, such as millions of field effect transistors.

In one embodiment, line trenches may be formed in an upper portion of the insulating matrix layer 635, and may be filled with at least one metallic material to form bit lines 10. The line trenches may be laterally spaced apart from one another along the first horizontal direction hd1, and may laterally extend along the second horizontal direction hd2 (which is herein referred as a bit line direction). In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. Other suitable metallic liner materials are within the contemplated scope of disclosure. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. Other suitable metallic fill materials are within the contemplated scope of disclosure. A planarization process, such as a chemical mechanical polishing (CMP) process, may be performed to remove portions of the metallic liner layer and the metallic fill material layer that overlie the horizontal plane including the top surface of the insulating matrix layer 635. Each remaining portion of the at least one metallic material comprises a bit line 10, which may be subsequently used to electrically bias bottom electrodes of thin film transistors to be formed.

The vertical thickness of the bit lines 10 may be in a range from 10 nm to 300 nm, such as from 30 nm to 100 nm, although lesser and greater vertical thicknesses may also be used. The bit lines 10 may be formed with a periodicity along the first horizontal direction hd1. The periodicity of the bit lines 10 may be the pitch of the field effect transistors along the first horizontal direction hd1, and may be, for example, in a range from 5 nm to 200 nm, such as from 10 nm to 100 nm, although lesser and greater periodicities may also be used. The periodicity of the bit lines 10 along the first horizontal direction hd1 is herein referred to as a first pitch p1. The width of each bit line 10 along the first horizontal direction hd1 may be in a range from 20% to 80%, such as from 30% to 70%, of the periodicity of the bit lines 10 along the first horizontal direction hd1.

Referring to FIGS. 3A-3E, a bottom-electrode-level dielectric layer 12 may be formed above the insulating matrix layer 635 and the bit lines 10, and may be patterned to form at least one array of openings therein. For example, a trimmable photoresist layer (not shown) may be applied over the bottom-electrode-level dielectric layer 12, and may be lithographically patterned to form an array of openings in the first photoresist layer. The array of openings in the trimmable photoresist layer may be transferred at least into an upper portion of the bottom-electrode-level dielectric layer 12 to form an array of cavities in the bottom-electrode-level dielectric layer 12 by performing a first anisotropic etch process. The trimmable photoresist layer may be isotropically trimmed to increase the size of the openings therethrough, and a second anisotropic etch process may be performed to extend the depth of pre-existing array of cavities down to the top surfaces of the bit lines 10 and to etch additional volumes of the upper portion of the bottom-electrode-level dielectric layer 12 around the pre-existing array of cavities. A two-dimensional array of stepped cavities may be formed in the bottom-electrode-level dielectric layer 12. Each stepped cavity includes a lower cavity portion having a respective first horizontal cross-sectional shape and located in a lower portion of the bottom-electrode-level dielectric layer 12, and an upper cavity portion having a respective second horizontal cross-sectional shape and located in an upper portion of the bottom-electrode-level dielectric layer 12. Each second horizontal cross-sectional shape may be laterally offset from the first horizontal cross-sectional shape of a same stepped cavity by a uniform lateral offset distance, which is the lateral trimming distance of the trimmable photoresist layer. The uniform lateral offset distance may be in a range from 1% to 20% of the periodicity of the bit lines 10 along the first horizontal direction hd1, and may be in a range from 1 nm to 40 nm, such as from 2 nm to 20 nm, although lesser and greater uniform lateral offset distances may also be used.

The two-dimensional array of stepped cavities may be filled with at least one metallic fill material. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the bottom-electrode-level dielectric layer 12.

Each remaining portion of the at least one metallic material comprises a combination of a bottom contact via structure 15 and a bottom electrode 20. Specifically, each remaining portion of the at least one metallic material that fills a lower portion of a stepped cavity having a respective first horizontal cross-sectional shape constitutes a bottom contact via structure 15, and each remaining portion of the at least one metallic material that fills an upper portion of a stepped cavity having a respective second horizontal cross-sectional shape constitutes a bottom electrode 20. While the present disclosure is described using an embodiment in which the bottom contact via structures 15 and the bottom electrodes 20 are formed simultaneously, embodiments are expressly contemplated herein in which the bottom contact via structures 15 are formed first, and the bottom electrodes 20 are formed subsequently.

A two-dimensional array of bottom contact via structures 15 and a two-dimensional array of bottom electrodes 20 may be formed within the bottom-electrode-level dielectric layer 12. Each bottom contact via structure 15 contacts a bottom surface of a respective one of the bottom electrodes 20. The bit lines 10 contact a respective column of the bottom contact via structures 15 that are arranged along the second horizontal direction hd2. Generally, the first horizontal cross-sectional shape of each bottom contact via structure 15 and the second horizontal cross-sectional shape of each bottom electrode 20 may be any two-dimensional shape having a closed periphery. For example, the horizontal cross-sectional shapes of the bottom contact via structures 15 and the bottom electrodes 20 may be shapes of a circle, ellipse, a rectangle, a rounded rectangle, or any two-dimensional curvilinear shape having a closed periphery. Other shapes are within the contemplated scope of disclosure. The top surfaces of the bottom electrodes 20 may be coplanar with the top surface of the bottom-electrode-level dielectric layer 12. The periodicity of the bottom electrodes 20 along the first horizontal direction hd1 may be the first pitch p1. The periodicity of the bottom electrodes 20 along the second horizontal direction hd2 is herein referred to as a second pitch.

Referring to FIGS. 4A-4E, a layer stack including an inter-electrode-level dielectric layer 262L, an optional etch stop dielectric layer 264L, and an inner-electrode-level dielectric layer 266L may be sequentially deposited over the bottom-electrode-level dielectric layer 12 and the array of bottom electrodes 20. The layer stack is herein referred to as pedestal-level dielectric layer 26L. Each of the inter-electrode-level dielectric layer 262L and the inner-electrode-level dielectric layer 266L comprises a dielectric material such as undoped silicate glass, a doped silicate glass, or porous or non-porous organosilicate glass. The thickness of each of the inter-electrode-level dielectric layer 262L and the inner-electrode-level dielectric layer 266L may be in a range from 20 nm to 300 nm, such as from 40 nm to 150 nm, although lesser and greater thicknesses may also be used. The etch stop dielectric layer 264L, if present, includes an etch stop dielectric material such as silicon nitride, a dielectric metal oxide, or silicon carbide nitride. The thickness of the etch stop dielectric layer 264L may be in a range from 2 nm to 20 nm, such as from 4 nm to 10 nm, although lesser and greater thicknesses may also be used.

Line trenches may be formed in the inner-electrode-level dielectric layer 266L. The line trenches laterally extend along the first horizontal direction hd1, and may be formed over a respective row of bottom electrodes 20 that are arranged along the first horizontal direction hd1. The line trenches may be centered on a respective row of bottom electrodes 20. The line trenches may be filled with at least one metallic material to form inner gate electrodes 42.

A first gate dielectric layer including at least one first gate dielectric material may be formed on sidewalls of the line trenches and over the top surface of the inner-electrode-level dielectric layer 266L. The at least one first gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. In one embodiment, the first gate dielectric material of the first gate dielectric layer may comprise an oxide of at least one metal selected from In, Zn, Ga, Sn, Pb, Zr, Sr, Ru, Mn, Mg, Nb, Ta, Hf, Al, La, Sc, Ti, V, Cr, Mo, W, Fe, Co, Ni, Pd, Ir, Ag, and combinations thereof. The total atomic percentage of the at least one metal in the first gate dielectric layer may be in a range from 25% to 60%, such as from 33.3% to 50%. Some metals may be present at a dopant concentration, such as less than 1.0%. Other suitable dielectric materials are within the contemplated scope of disclosure. The at least one first gate dielectric material may be deposited by atomic layer deposition or chemical vapor deposition although other suitable deposition processes may be used. The thickness of the first gate dielectric layer may be in a range from 1 nm to 30 nm, such as from 2 nm to 10 nm, although lesser and greater thicknesses may also be used.

At least one first gate electrode material may be deposited in remaining volumes of the line trenches. In one embodiment, the at least one first gate electrode material may comprise a metallic material and/or a doped semiconductor material. For example, the at least one first gate electrode material may comprise Ta, Al, Ti, Mo, Au, Pd, Ni, Ir, Pt, W, TiN, TaN, WN, doped silicon, a doped silicon-germanium alloy, or combinations thereof.

A planarization process, such as a chemical mechanical polishing (CMP) process, may be performed to remove portions of the at least one first gate electrode material and the first gate dielectric layer from above a horizontal plane including the top surface of the inner-electrode-level dielectric layer 266L. Each remaining portion of the at least one first gate electrode material that remains in a respective line trench comprises a gate electrode, which is herein referred to as an inner gate electrode 42 or as a first gate electrode. Each remaining portion of the first gate dielectric layer that remains in a line trench comprises a gate dielectric, which is herein referred to as an inner gate dielectric 40 or a first gate dielectric. Each inner gate dielectric 40 may have a U-shaped vertical cross-sectional profile, and may include a horizontally-extending portion and a pair of vertically-extending portions to a respective edge region of the horizontally-extending portion.

The inner gate electrodes 42 may be formed with a periodicity along the second horizontal direction hd2. The periodicity of the inner gate electrodes 42 may be the pitch of the field effect transistors along the second horizontal direction hd2, which is the second pitch p2. The width of each inner gate electrodes 42 along the second horizontal direction hd2 may be in a range from 5% to 40%, such as from 10% to 30%, of the second pitch p2.

Referring to FIGS. 5A-5E, an optional gate cap dielectric layer 44L and a top-electrode-level dielectric layer 46L may be deposited over the inner gate electrodes 42. The optional gate cap dielectric layer 44L comprises a dielectric material that may function as an etch stop material during a subsequent etch process that patterns the top-electrode-level dielectric layer 46L and the pedestal-level dielectric layer 26L. For example, the gate cap dielectric layer 44L, if present, may comprise silicon nitride, a dielectric metal oxide material, or silicon carbide nitride, and may have a thickness in a range from 2 nm to 20 nm, such as from 4 nm to 10 nm, although lesser and greater thicknesses may also be used. The top-electrode-level dielectric layer 46L comprises a dielectric material such as undoped silicate glass, a doped silicate glass, or porous or non-porous organosilicate glass. The thickness of each of the top-electrode-level dielectric layer 46L may be in a range from 20 nm to 400 nm, such as from 40 nm to 300 nm, although lesser and greater thicknesses may also be used.

A photoresist layer (not shown) may be applied over the top surface of the top-electrode-level dielectric layer 46L, and may be lithographically patterned to form an array of openings having a same two-dimensional periodicity as the two-dimensional array of bottom electrodes 20. According to an aspect of the present disclosure, the areas of the openings in the photoresist layer may be located entirely within the areas of the two-dimensional array of bottom electrodes 20. In this embodiment, the periphery of each opening in the photoresist layer may be laterally offset inward from the periphery of a top surface of an underlying bottom electrode 20. In one embodiment, the lateral offset distance between the periphery of each opening in the photoresist layer and the periphery of the top surface of the underlying bottom electrode 20 in a plan view may be in a range from 1% to 30%, such as from 2% to 20% and/or from 3% to 10%, of the maximum lateral dimension of the underlying bottom electrode 20. For example, the lateral offset distance between the periphery of each opening in the photoresist layer and the periphery of the top surface of the underlying bottom electrode 20 in the plan view may be in a range from 0.5 nm to 100 nm, such as from 2 nm to 20 nm, although lesser and greater lateral offset distances may also be used.

An anisotropic etch process may be performed using the patterned photoresist layer as an etch mask layer. A two-dimensional array of top electrode cavities may be formed in the top-electrode-level dielectric layer 46L underneath the two-dimensional array of openings in the photoresist layer. The depth of the top electrode cavities may be less than the thickness of the top-electrode-level dielectric layer 46L. For example, the depth of the top electrode cavities may be a range from 15 nm to 300 nm, such as from 30 nm to 200 nm, although lesser and greater thicknesses may also be used. The photoresist layer may be subsequently removed, for example, by ashing.

The two-dimensional array of top electrode cavities may be filled with at least one metallic fill material. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the top-electrode-level dielectric layer 46L. Remaining portions of the at least one metallic material comprise top electrodes 60. Top surfaces of the top electrodes 60 may be coplanar with the top surface of the top-electrode-level dielectric layer 46L. A two-dimensional array of top electrodes 60 may be formed in the top-electrode-level dielectric layer 46L.

Referring to FIGS. 6A-6E, a photoresist layer 47 may be applied over the top surfaces of the top electrodes 60 and the top-electrode-level dielectric layer 46L, and may be lithographically patterned into discrete line-shaped portions. In one embodiment, the patterned portions of the photoresist layer 47 may have the same pattern as, and have an areal overlap in a plan view with, the line trenches (which are filled with combinations of an inner gate dielectric 40 and an inner gate electrode 42).

The top-electrode-level dielectric layer 46L, the pedestal-level dielectric layer 26L (including the inner-electrode-level dielectric layer 266L) may be patterned with a composite pattern that includes a line pattern of the photoresist layer 47 and a pattern of the top electrodes 60 by performing an anisotropic etch process. The top-electrode-level dielectric layer 46L, the optional gate cap dielectric layer 44L, the inner-electrode-level dielectric layer 266L, the optional etch stop dielectric layer 264L, and the inter-electrode-level dielectric layer 262L are patterned with the composite pattern. Each patterned portion of the top-electrode-level dielectric layer 46L constitutes an upper dielectric pillar portion 46. Each patterned portion of the gate cap dielectric layer 44L, if present, constitutes a gate cap dielectric plate 44. Each patterned portion of the inner-electrode-level dielectric layer 266L constitutes a middle dielectric pillar portion 266. Each patterned portion of the etch stop dielectric layer 264L, if present, constitutes an etch stop dielectric plate 264. Each patterned portion of the inter-electrode-level dielectric layer 262L constitutes a lower dielectric pillar portion 262. The middle dielectric pillar portion 266, etch stop dielectric plate 264, and lower dielectric pillar portion 262 constitute a layer stack 26.

A pair of middle dielectric pillar portion 266 and a pair of etch stop dielectric plates 264 may underlie each top electrode 60. A lower dielectric pillar portion 262 and an upper dielectric pillar portion 46 may continuously extend along the first horizontal direction hd1 underneath a row of top electrodes 60. Each contiguous stack of a lower dielectric pillar portion 262, etch stop dielectric plates 264, pairs of middle dielectric pillar portion 266, an optional gate cap dielectric plate 44, and an upper dielectric pillar portion 46 constitutes a dielectric pillar structure (262, 264, 266, 44, 46). Vertical stacks including a row of bottom electrodes 20, a dielectric pillar structure (262, 264, 266, 44, 46), and a row of top electrodes 60 may be formed.

Optionally, the anisotropic etch process may be extended to etch an upper portion of the bottom-electrode-level dielectric layer 12. In this embodiment, the combination of the photoresist layer 47, the top electrodes 60, and the bottom electrodes 20 may be used as a composite etch mask that defines the area of the bottom-electrode-level dielectric layer 12 to be vertically recessed by the anisotropic etch process. In one embodiment, peripheral portions of the bottom electrodes 20 may be collaterally chamfered during the anisotropic etch process. In one embodiment, portions of the top electrodes 60 that are not masked by the photoresist layer 47 may be chamfered during the anisotropic etch process. The photoresist layer 47 may be subsequently removed, for example, by ashing.

Referring to FIGS. 7A-7E, a continuous active layer 30L and a second gate dielectric layer 50L may be sequentially deposited over the vertical stacks {20, (262, 264, 266, 44, 46), 60}.

The continuous active layer 30L may be deposited over the vertical stacks {20, (262, 264, 266, 44, 46), 60}. In one embodiment, the semiconducting material may include a material providing electrical conductivity in a range from 1.0 S/cm to $1.0 \times 10^5$ S/cm upon suitable doping with electrical dopants (which may be p-type dopants or n-type dopants). Exemplary semiconducting materials that may be used for the continuous active layer 30L include, but are not limited to, indium gallium zinc oxide (IGZO), indium tungsten oxide, indium zinc oxide, indium tin oxide, gallium oxide, indium oxide, doped zinc oxide, doped indium oxide (such as tungsten-doped indium oxide), doped cadmium oxide, and various other doped variants derived therefrom. Other suitable semiconducting materials are within the contemplated scope of disclosure. In one embodiment, the semiconducting material of the continuous active layer 30L may include indium gallium zinc oxide.

The continuous active layer 30L may include an amorphous semiconducting material or a polycrystalline semiconducting material. The continuous active layer 30L may be deposited by physical vapor deposition or atomic layer deposition although other suitable deposition processes may be used. The thickness of the continuous active layer 30L may be in a range from 1 nm to 100 nm, such as from 2 nm to 50 nm and/or from 3 nm to 20 nm, although lesser and greater thicknesses may also be used. The continuous active layer 30L comprises a horizontally-extending portion that laterally extends between neighboring pairs of the vertical stacks {20, (262, 264, 266, 44, 46), 60} over the entire area of the memory array region 100, vertically-extending portions laterally surrounding, and contacting, a respective vertical stack {20, (262, 264, 266, 44, 46), 60}, and capping portions overlying a respective vertical stack {20, (262, 264, 266, 44, 46), 60} within the vertical stacks {20, (262, 264, 266, 44, 46), 60}.

The second gate dielectric layer 50L may be formed over the continuous active layer 30L by deposition of at least one second gate dielectric material. The at least one second gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. In one embodiment, the second gate dielectric material of the second gate dielectric layer 50L may comprise an oxide of at least one metal selected from In, Zn, Ga, Sn, Pb, Zr, Sr, Ru, Mn, Mg, Nb, Ta, Hf, Al, La, Sc, Ti, V, Cr, Mo, W, Fe, Co, Ni, Pd, Ir, Ag, and combinations thereof. The total atomic percentage of the at least one metal in the second gate dielectric layer 50L may be in a range from 25% to 60%, such as from 33.3% to 50%. Some metals may be present at a dopant concentration, such as less than 1.0%. Other suitable dielectric materials are within the contemplated scope of disclosure. The at least one second gate dielectric material may be deposited by atomic layer deposition or chemical vapor deposition although other suitable deposition processes may be used. The thickness of the second gate dielectric layer 50L may be in a range from 1 nm to 30 nm, such as from 2 nm to 10 nm, although lesser and greater thicknesses may also be used.

Referring to FIGS. 8A-8E, a sacrificial matrix layer may be deposited over the second gate dielectric layer 50L. The sacrificial matrix layer includes a material that may be subsequently removed selective to the material of the second gate dielectric layer 50L. For example, the sacrificial matrix layer may comprise silicon nitride, organosilicate glass, borosilicate glass, amorphous silicon, a silicon-germanium alloy, or a carbon-based material such as amorphous carbon or diamond-like carbon. In one embodiment, the sacrificial matrix layer may be deposited by a nonconformal deposition process such as plasma-enhanced chemical vapor deposition (PECVD) process. Optionally, a planarization process such as a chemical mechanical polishing (CMP) process may be performed to planarize the top surface of the sacrificial matrix layer.

A photoresist layer (not shown) may be formed over the sacrificial matrix layer, and may be lithographically patterned into a two-dimensional array of photoresist material portions having the first pitch p1 along the first horizontal direction hd1 and having the second pitch p2 along the second horizontal direction hd2. Each patterned portion of the photoresist layer covers a respective top electrode 60, and has a periphery that is laterally offset outward from the sidewall of the respective top electrode 60 by a lateral offset distance that is the sum of a thickness of the continuous active layer 30L, the thickness of the second gate dielectric layer 50L, and the lateral thickness of vertically-extending portions of each outer gate electrode to be subsequently formed. The lateral thickness of the vertically-extending portions of each outer gate electrode to be subsequently formed may be in a range from 10 nm to 150 nm, such as from 20 nm to 60 nm, although lesser and greater lateral thicknesses may also be used. The horizontal cross-sectional shape of each photoresist material portion may be a circle, an ellipse, a rectangle, a rounded rectangle, or any two-dimensional shape having a closed periphery and having a greater width than an underlying inner gate dielectric 40 along the second horizontal direction hd2.

An anisotropic etch process may be performed to transfer the pattern of the photoresist layer through the sacrificial matrix layer, the second gate dielectric layer 50L, and the continuous active layer 30L, and into an upper portion of the bottom-electrode-level dielectric layer 12. Each patterned remaining portion of the sacrificial matrix layer comprises a sacrificial material portion 57. A two-dimensional array of sacrificial material portions 57 may be formed around the two-dimensional array of top electrodes 60 and underlying material portions. The two-dimensional array of sacrificial material portions 57 may have the first pitch p1 along the first horizontal direction hd1 and the second pitch p2 along the second horizontal direction hd2.

Each patterned portion of the second gate dielectric layer 50L constitutes an outer gate dielectric 50, which is also referred to as a second gate dielectric. A two-dimensional periodic array of outer gate dielectrics 50 may be formed. Each patterned portion of the continuous active layer 30L constitutes an active layer 30. A two-dimensional array of active layers 30 may be formed.

A network of isolation trenches 69 may be formed in volumes from which the materials of the sacrificial matrix layer, the second gate dielectric layer 50L, the continuous active layer 30L, and the upper portion of the bottom-electrode-level dielectric layer 12 are removed. The network of isolation trenches 69 comprises an interconnected network of laterally-extending cavities that laterally extend along the first horizontal direction hd1 and along the second horizontal direction hd2. The isolation trench surrounding each patterned portion of the sacrificial matrix layer. The network of isolation trenches 69 laterally surrounds the two-dimensional array of sacrificial material portions 57. The patterned photoresist layer may be subsequently removed, for example, by ashing.

Referring to FIGS. 9A-9E, a dielectric fill material that is different from the material of the sacrificial material portions 57 may be deposited in the network of isolation trenches 69. In an illustrative example, if the sacrificial material portions 57 comprise silicon nitride, the dielectric fill material may comprise a silicon oxide material such as undoped silicate glass or a doped silicate glass. In one embodiment, the dielectric fill material may be conformally deposited to fill the volumes of the network of isolation trenches 69.

Portions of the dielectric fill material deposited outside the network of isolation trenches 69 may be removed by a planarization process such as a recess etch process and/or a chemical mechanical planarization process. The remaining portion of the dielectric fill material constitutes a dielectric isolation matrix 64. The dielectric isolation matrix 64 comprises a dielectric material such as silicon oxide, and laterally surrounds each of the sacrificial material portions 57. The top surface of the dielectric isolation matrix 64 may be located in the same horizontal plane as the top surfaces of the sacrificial material portions 57. Generally, the dielectric isolation matrix 64 may be formed by depositing a dielectric material in gaps located between neighboring pairs of sacrificial material portions 57.

Referring to FIGS. 10A-10E, a photoresist layer (not shown) may be applied over the sacrificial material portions 57 and the dielectric isolation matrix 64, and may be lithographically patterned to form a two-dimensional array of openings. Each of the openings in the photoresist layer may be located within the area of a respective underlying sacrificial material portion 57. An anisotropic etch process may be performed to etch unmasked regions of the sacrificial material portions 57. Contact recesses are formed within volumes from which the material of the sacrificial material portions 57 are removed. A top surface of an outer gate dielectric 50 may be physically exposed at the bottom of each contact recess. Sidewalls of the contact recesses may be vertical, or may be tapered, or may comprise vertical segments and tapered segments.

A dielectric material may be deposited in the contact recesses and over the sacrificial material portions 57. The dielectric material may include undoped silicate glass, a doped silicate glass, or organosilicate glass. Excess portions of the dielectric material may be removed from above the horizontal plane including the top surfaces of the sacrificial material portions 57 by performing a planarization process such as a chemical mechanical polishing (CMP) process. Remaining portions of the dielectric material fill in the contact recesses constitute capping dielectric plates 68. The top surfaces of the capping dielectric plates 68 may be coplanar with the top surfaces of the dielectric isolation matrix 64 and the sacrificial material portions 57.

Referring to FIGS. 11A-11F, a two-dimensional array of recess regions 55 may be formed by vertically recessing upper portions of the dielectric isolation matrix 64 between neighboring pairs of sacrificial material portions 57 that are laterally spaced apart along the first horizontal direction hd1. For example, a photoresist layer (not shown) may be applied over the dielectric isolation matrix 64 and the sacrificial material portions 57, and may be lithographically patterned to form openings that straddle portions of the dielectric isolation matrix 64 located between neighboring pairs of sacrificial material portions 57 that are laterally spaced apart along the first horizontal direction hd1. An anisotropic etch process may be performed to vertical recess the unmasked portions of the dielectric isolation matrix 64. Cavities formed underneath the openings in the photoresist layer constitute the recess regions 55. Surfaces of a pair of sacrificial material portions 57 are physically exposed around each recess region 55. In some embodiments, unmasked portions of the sacrificial material portion 57 may be etched by the anisotropic etch process. The photoresist layer may be subsequently removed, for example, by ashing.

Figure 12D:
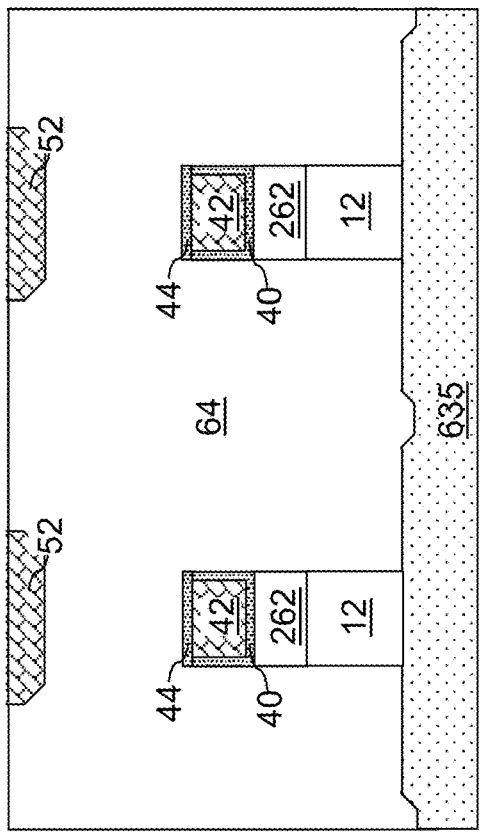
Figure 12E:
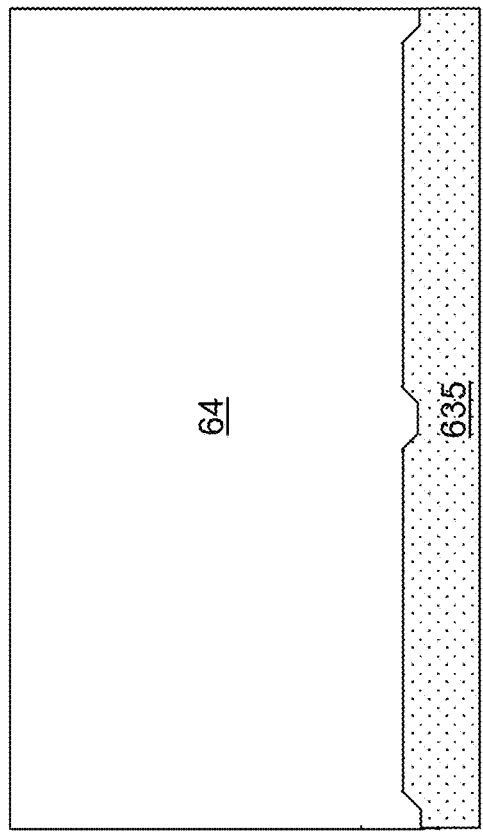
Figure 12F:
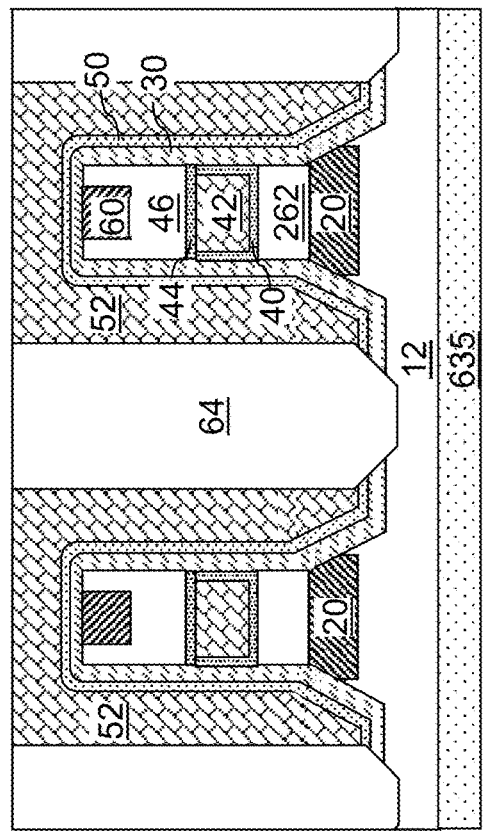
Figure 13D:
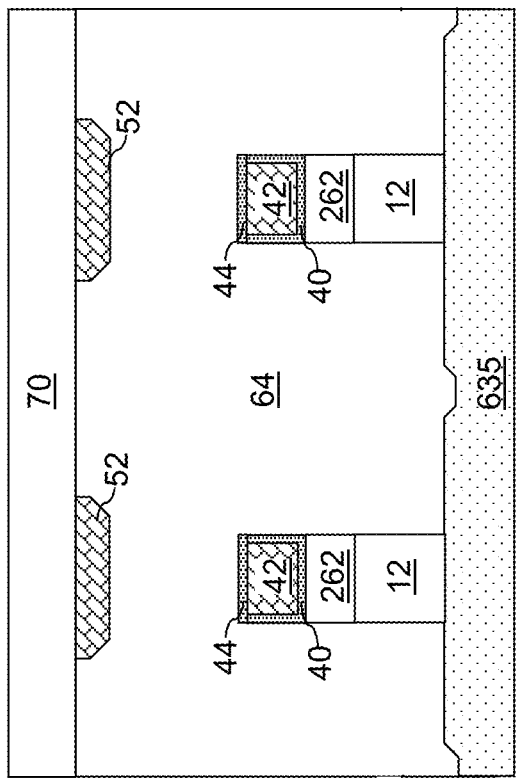
Figure 13E:
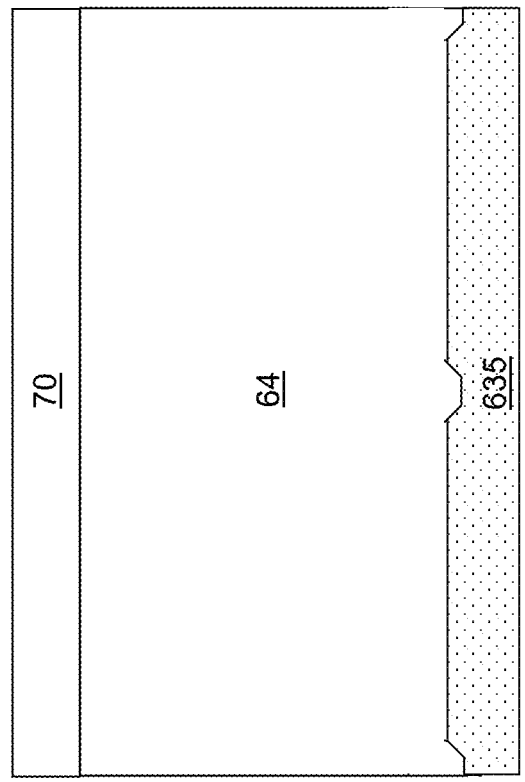
Figure 13F:
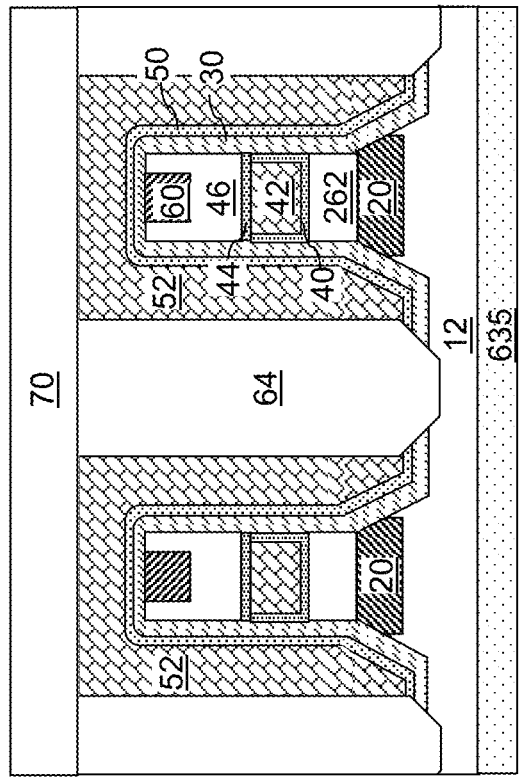

Referring to FIGS. 12A-12C, a selective removal process may be performed to remove the material of the sacrificial material portions 57 selective to the materials of the outer gate dielectrics 50 and the dielectric isolation matrix 64. The selective removal process may comprise an etch process such as an isotropic etch process, or may comprise an ashing process in embodiments in which the sacrificial material portions 57 comprise an ashable material. For example, if the sacrificial material portions 57 comprise silicon nitride, a wet etch process using hot phosphoric acid may be performed to remove the sacrificial material portions 57. Alternatively, if the sacrificial material portions 57 comprise an ashable material such as amorphous carbon, an ashing process may be used to remove the sacrificial material portions 57. Gate cavities are formed in volumes from which the sacrificial material portions 57 are removed. Each gate cavity laterally extends continuously along the first horizontal direction hd1, and laterally surrounds a vertical stack {20, (262, 264, 266, 44, 46), 60}.

At least second gate electrode material may be deposited in the gate cavities. In one embodiment, the at least one second gate electrode material may comprise a metallic material and/or a doped semiconductor material. For example, the at least one second gate electrode material may comprise Ta, Al, Ti, Mo, Au, Pd, Ni, Ir, Pt, W, TiN, TaN, WN, doped silicon, a doped silicon-germanium alloy, or combinations thereof.

A planarization process, such as a chemical mechanical polishing (CMP) process, may be performed to remove portions of the metallic liner layer and the metallic fill material layer that overlie the horizontal plane including the top surface of the dielectric isolation matrix 64. Each remaining portion of the at least one metallic material comprises an outer gate electrode 52, which is also referred to as a second gate electrode. In one embodiment, top surfaces of the outer gate electrodes 52 may be coplanar with the top surfaces of the dielectric isolation matrix 64. Each outer gate electrode 52 is formed over a row of outer gate dielectrics 50 that are arranged along the first horizontal direction hd1. Generally, the outer gate electrodes 52 may be formed by depositing at least one conductive material in the gate cavities.

The outer gate electrodes 52 laterally surround, and overlie, a respective row of the outer gate dielectrics 50. The outer gate electrodes 52 laterally extend along the first horizontal direction hd1, and are laterally spaced apart long the second horizontal direction hd2. Each outer gate electrode 52 laterally surrounds a respective vertical stack {20, (262, 264, 266, 44, 46), 60} of a row of bottom electrodes 20, a dielectric pillar structure (262, 264, 266, 44, 46), and a row of top electrodes 60. Each vertically-extending portion of an active layer 30 comprises a channel region of a thin film transistor, and is laterally surrounded by a respective outer gate electrode 52, and laterally surrounds a portion of a respective inner gate electrode 42. Thus, the outer gate electrodes 52 and the inner gate electrodes 42 of the present disclosure provide a dual gate configuration for each vertical thin film transistor.

Referring to FIGS. 13A-13F, a dielectric material may be deposited over the outer gate electrodes 52 and the dielectric isolation matrix 64 to form a contact-level dielectric layer 70. The contact-level dielectric layer 70 may comprise undoped silicate glass, a doped silicate glass, or organosilicate glass, and may have a thickness in a range from 50 nm to 500 nm, although lesser and greater thicknesses may also be used.

A photoresist layer (not shown) may be applied over the contact-level dielectric layer 70, and may be lithographically patterned to form a two-dimensional array of opening therein. The pattern of the two-dimensional array of openings in the photoresist layer may have the same periodicity as the two-dimensional array of top electrodes 60. The size of each opening in the photoresist layer may be smaller than the size of an underlying capping dielectric plate 68. An anisotropic etch process is performed to transfer the pattern of the openings in the photoresist layer through the contact-level dielectric layer 70, the capping dielectric plates 68, the outer gate dielectrics 50, and the active layers 30. Contact via cavities are formed in volumes from which the materials of the contact-level dielectric layer 70, the capping dielectric plates 68, the outer gate dielectrics 50, and the active layers 30 are removed. A top surface of a top electrode 60 may be physically exposed at the bottom of each contact via cavity.

At least one metallic fill material may be deposited in the contact via cavities. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the contact-level dielectric layer 70. Each remaining portion of the at least one metallic material comprises a top contact via structure 80. In one embodiment, top surfaces of the top contact via structures 80 may be coplanar with the top surface of the contact-level dielectric 70. Each of the top electrodes 60 may be contacted by a respective one of the top contact via structures 80.

The contact-level dielectric layer 70 overlies the outer gate electrodes 52, the active layers 30, the outer gate dielectrics 50, and the vertical stacks {20, (262, 264, 266, 44, 46), 60}. The top contact via structures 80 are formed through the contact-level dielectric layer 70 and on a respective one of the top electrodes 60. A two-dimensional array of top contact via structures 80 vertically extends through the contact-level dielectric layer 70, and contacts a respective one of the top electrodes 60. A two-dimensional array of vertical field effect transistors 900 is formed.

Figure 14A:
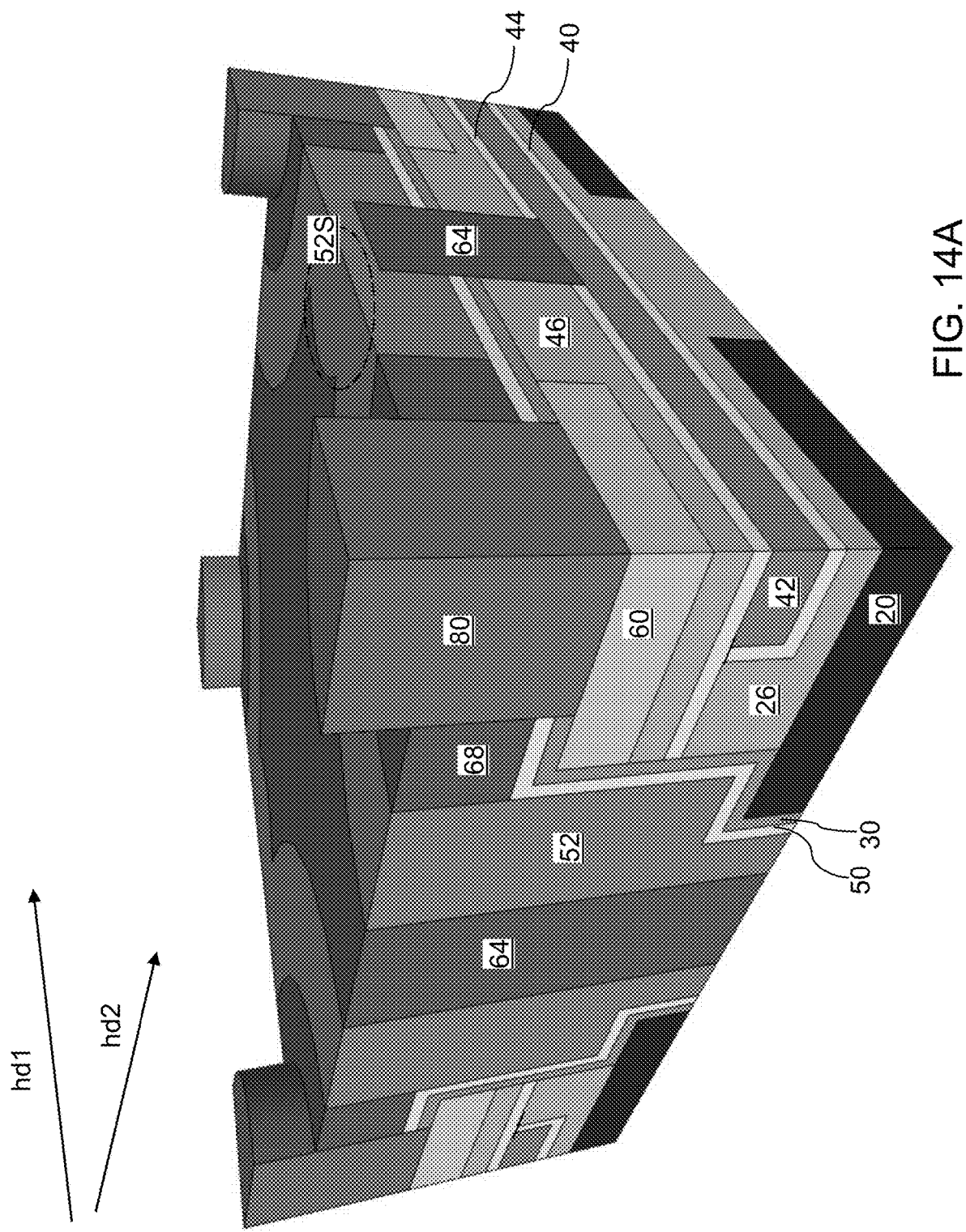
FIGS. 14A, 14B, and 14C are perspective views of a portion of memory array region of the exemplary structure after formation of top contact via structures. A contact-level dielectric layer is not illustrated for clarity.
Figure 14B:
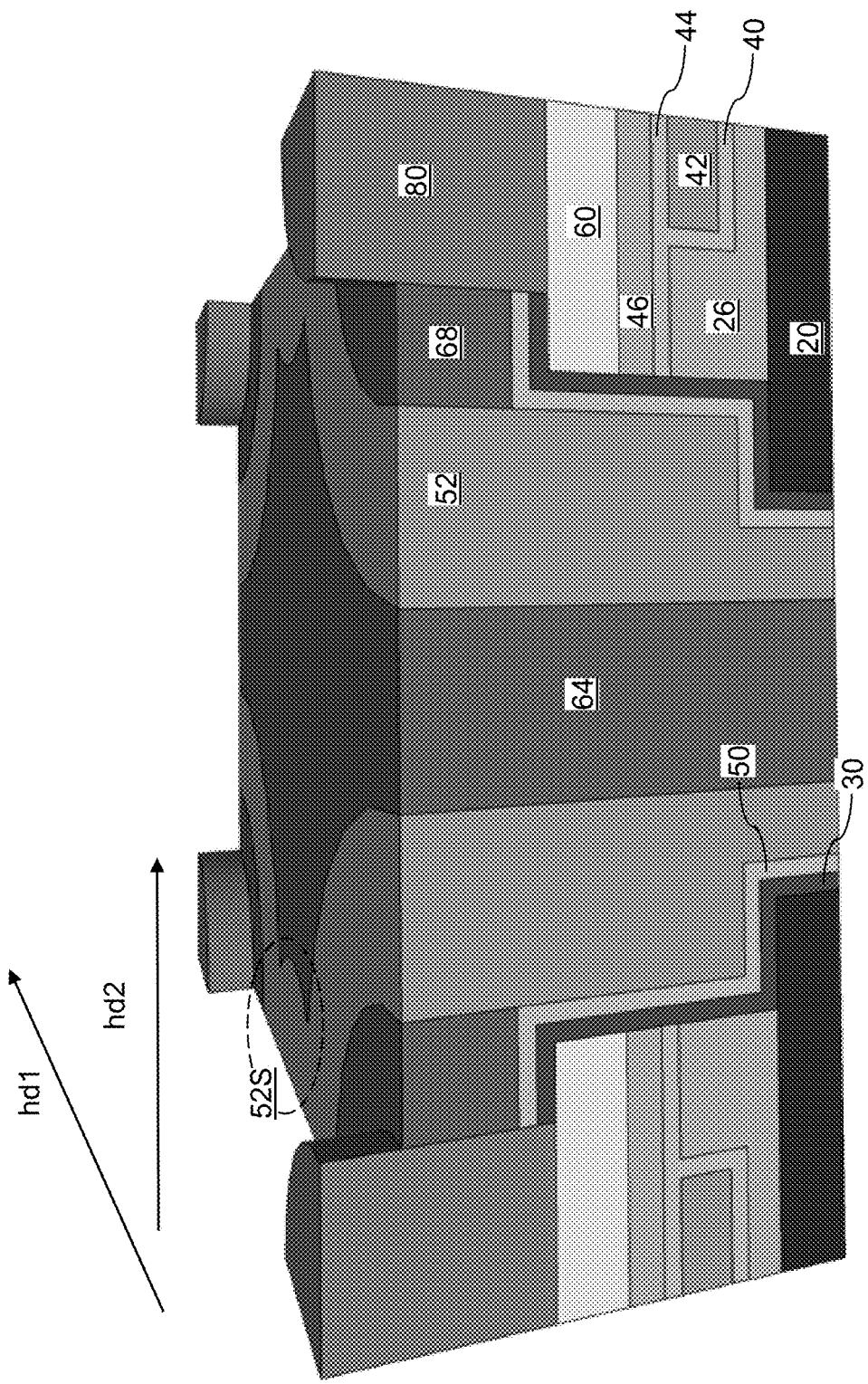
Figure 14C:
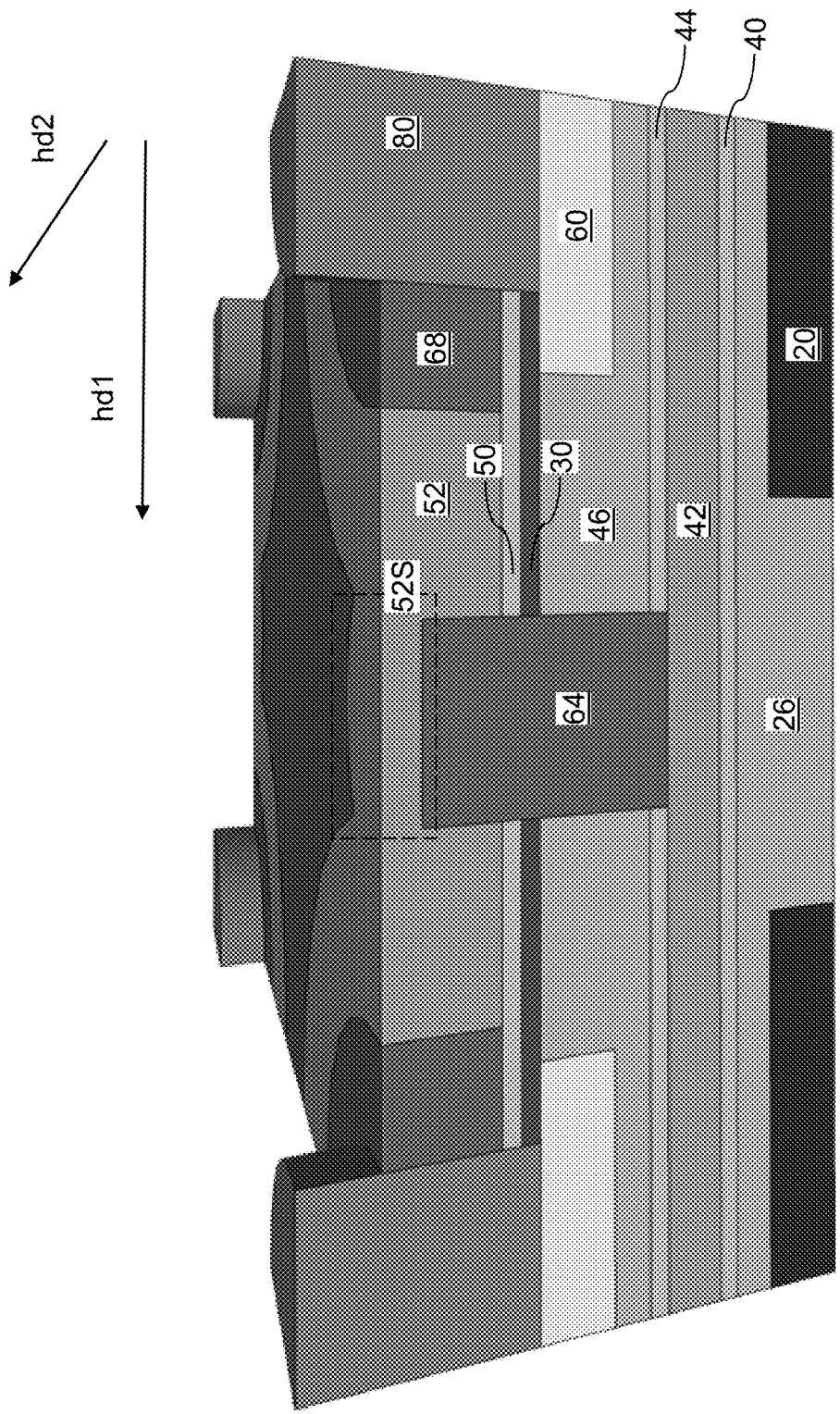

Referring to FIGS. 14A-14C, a portion of the exemplary structure illustrated in various perspective views. The contact-level dielectric layer 70 is omitted for clarity. Each of the outer gate electrodes 52 comprises a row of tubular gate electrode regions that laterally surround a respective one of the layer stacks (30, 50) of an active layer 30 and an outer gate dielectric 50, and a row of gate electrode stitch regions 52S interlaced with the row of tubular gate electrode portions and contacting upper portions of a respective neighboring pair of tubular gate electrodes within the row of tubular gate electrode portions. It should be noted that only a quadrant of a tubular gate electrode region of an outer gate electrode 52 is illustrated around each of the top contact via structures 80 in each of FIGS. 14A-14C In one embodiment, top surfaces of the row of tubular gate electrode regions and the row of gate electrode stitch regions 52S are located within a same horizontal plane which is a horizontal plane including the top surface of the dielectric isolation matrix 64. In one embodiment, a dielectric isolation matrix 64 laterally surrounds each of the tubular gate electrode regions of the outer gate electrodes 52. The dielectric isolation matrix may comprise recessed surfaces that contact bottom surfaces of the gate electrode stitch regions 52S. In one embodiment, the top surfaces of the row of tubular gate electrode regions, the row of gate electrode stitch regions 52S, and the dielectric isolation matrix 64 may be located within a same horizontal plane.

Figure 15:
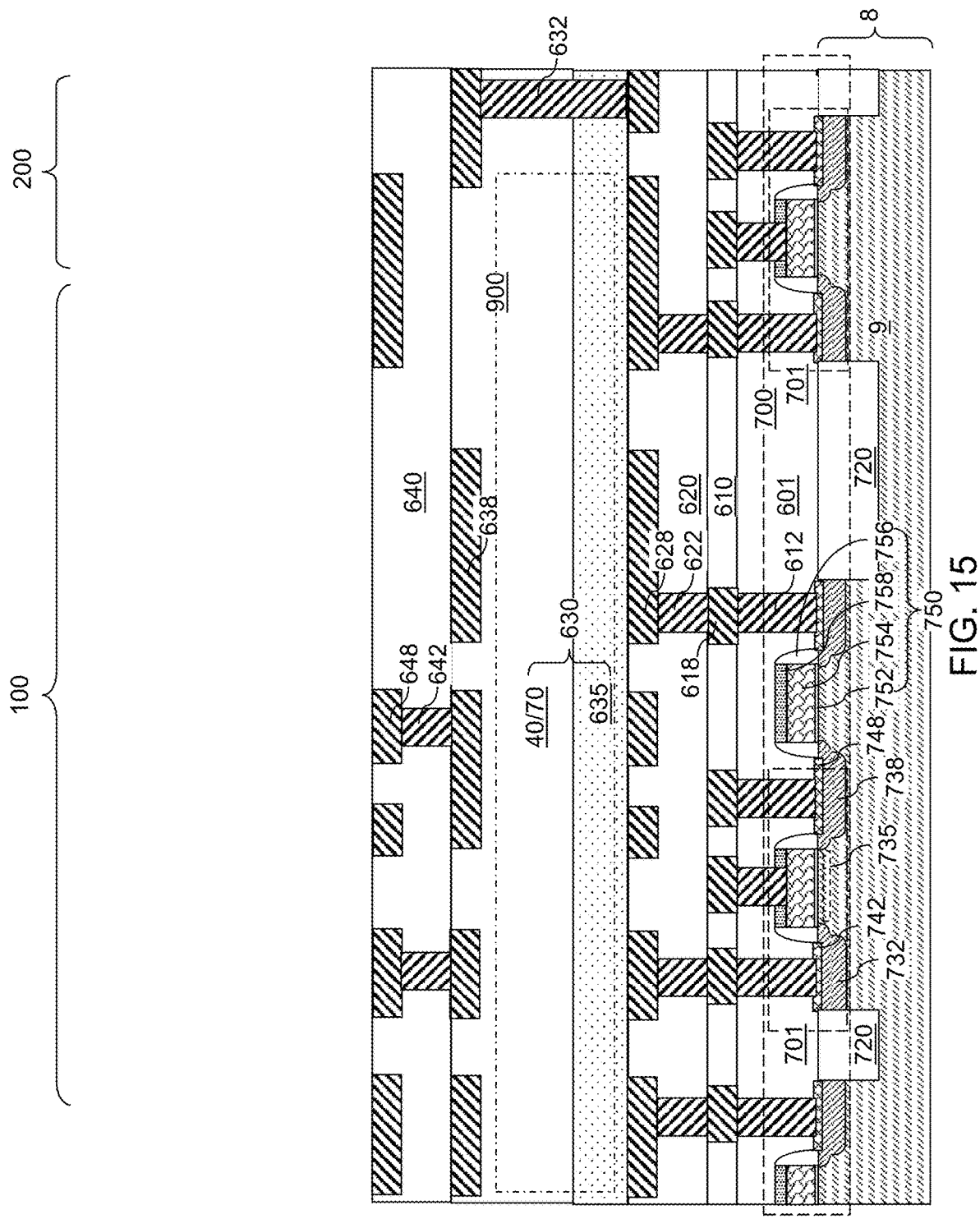
FIG. 15 is a vertical cross-sectional view of an exemplary structure after formation of upper dielectric material layers and upper metal interconnect structures.

Referring to FIG. 15, an exemplary structure is illustrated after formation of a two-dimensional array of vertical field effect transistors 900 over the insulating matrix layer 635. Various additional metal interconnect structures (632, 638) may be formed through the insulating matrix layer 635 and various dielectric material portions/layers 630 that are formed at the level of the vertical field effect transistors 900. Additional interconnect-level dielectric material layer and additional metal interconnect structures may be subsequently formed. For example, a fourth interconnect-level dielectric material layer 640 embedding fourth metal line structures 648 and third metal via structures 642 may be formed. While the present disclosure is described using an embodiment in which four levels of metal line structures are used, embodiments are expressly contemplated herein in which a lesser or greater number of interconnect levels are used.

Figure 16:
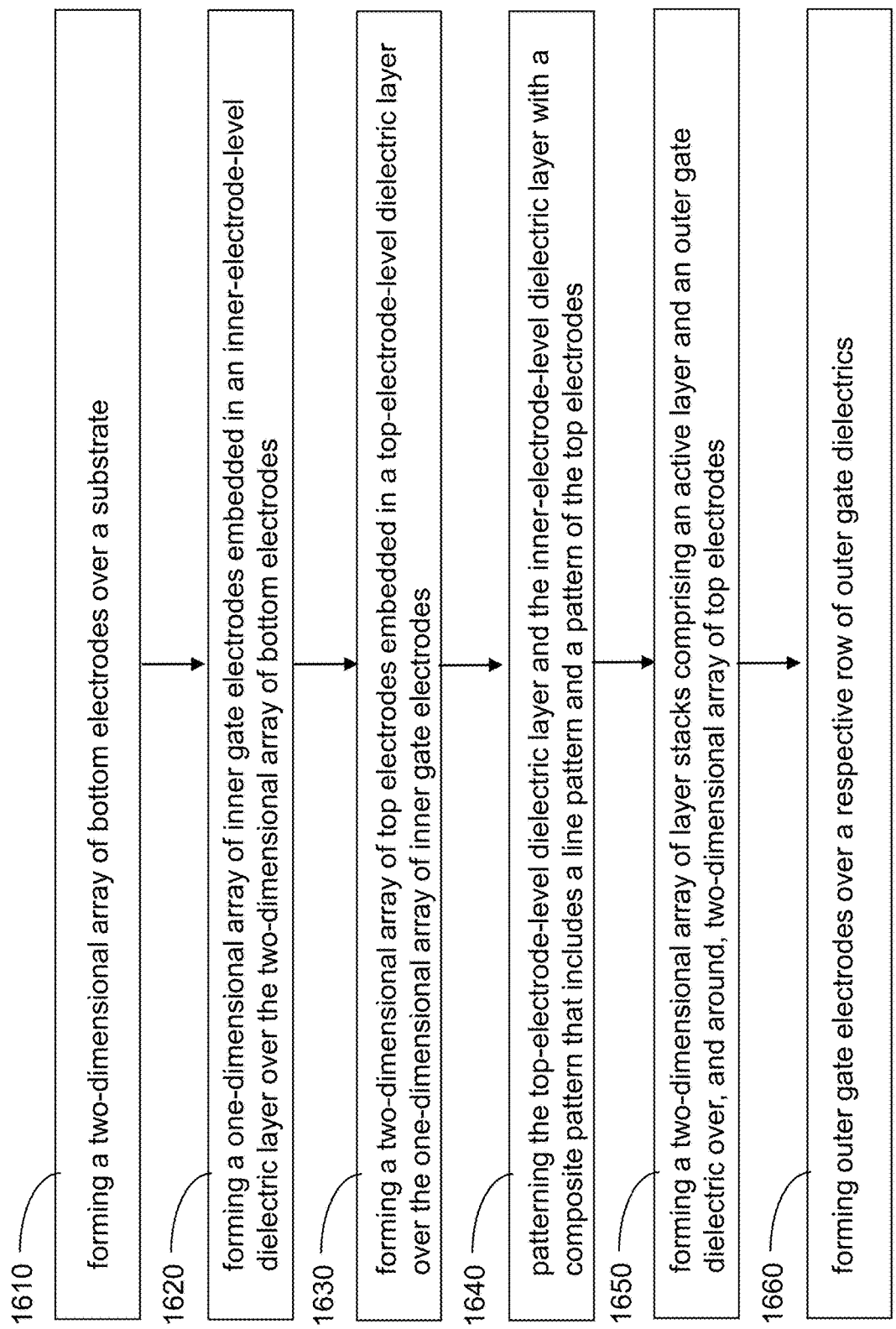
FIG. 16 is a flowchart that illustrates the general processing steps for manufacturing the semiconductor device of the present disclosure.

Referring to FIG. 16, a flowchart that illustrates the general processing steps for manufacturing the semiconductor devices of the present disclosure.

Referring to step 1610 and FIGS. 1-3E, a two-dimensional array of bottom electrodes 20 may be formed over a substrate 8.

Referring to step 1620 and FIGS. 4A-4E, a one-dimensional array of inner gate electrodes 42 embedded in an inner-electrode-level dielectric layer 266L may be formed over the two-dimensional array of bottom electrodes 20.

Figure 5B:
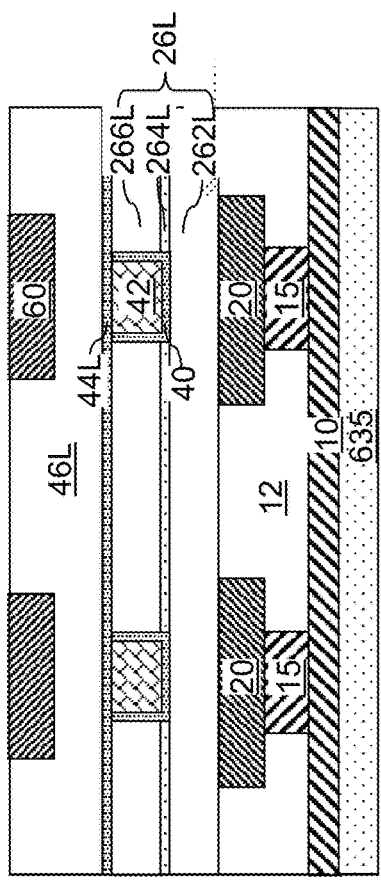
Figure 5C:
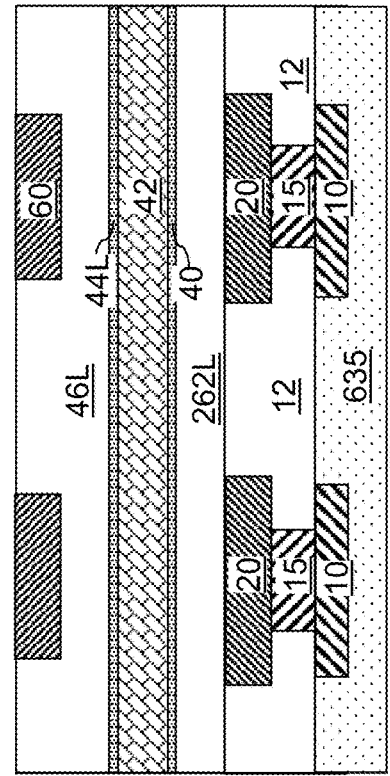
Figure 5A:
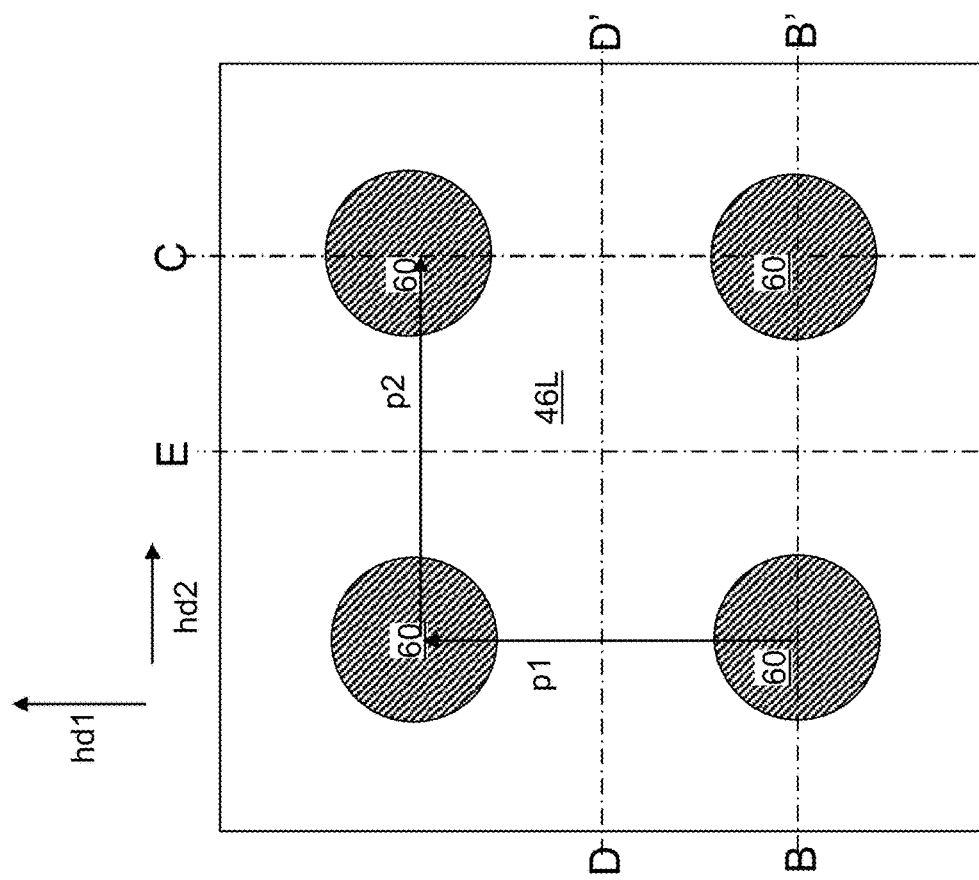
Figure 9D:
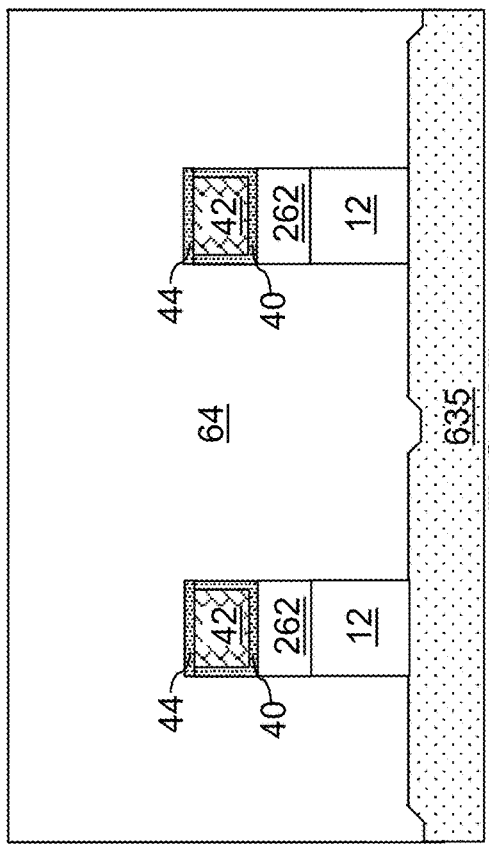
Figure 9E:
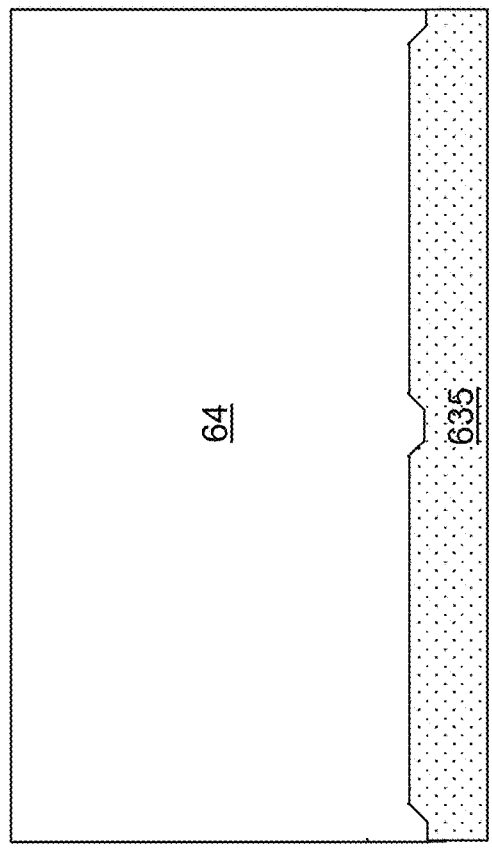
Figure 10B:
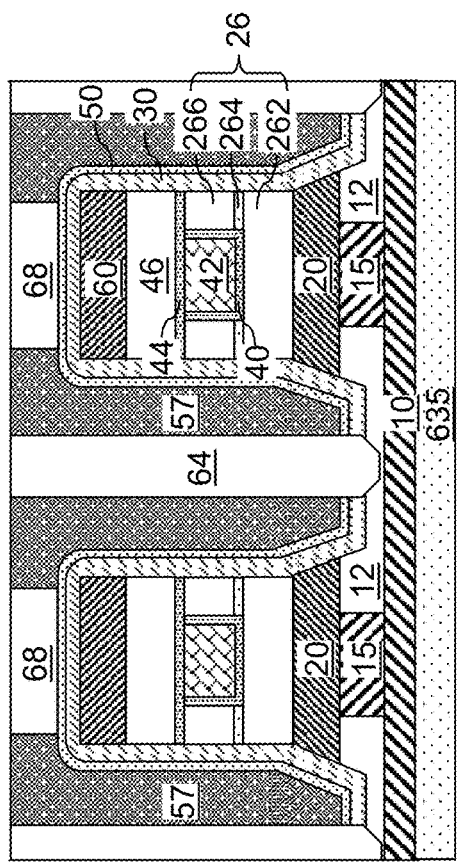
Figure 10C:
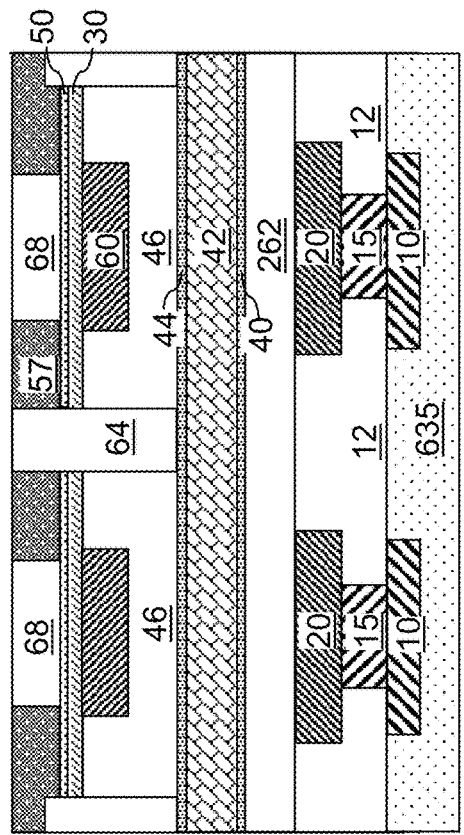
Figure 10A:
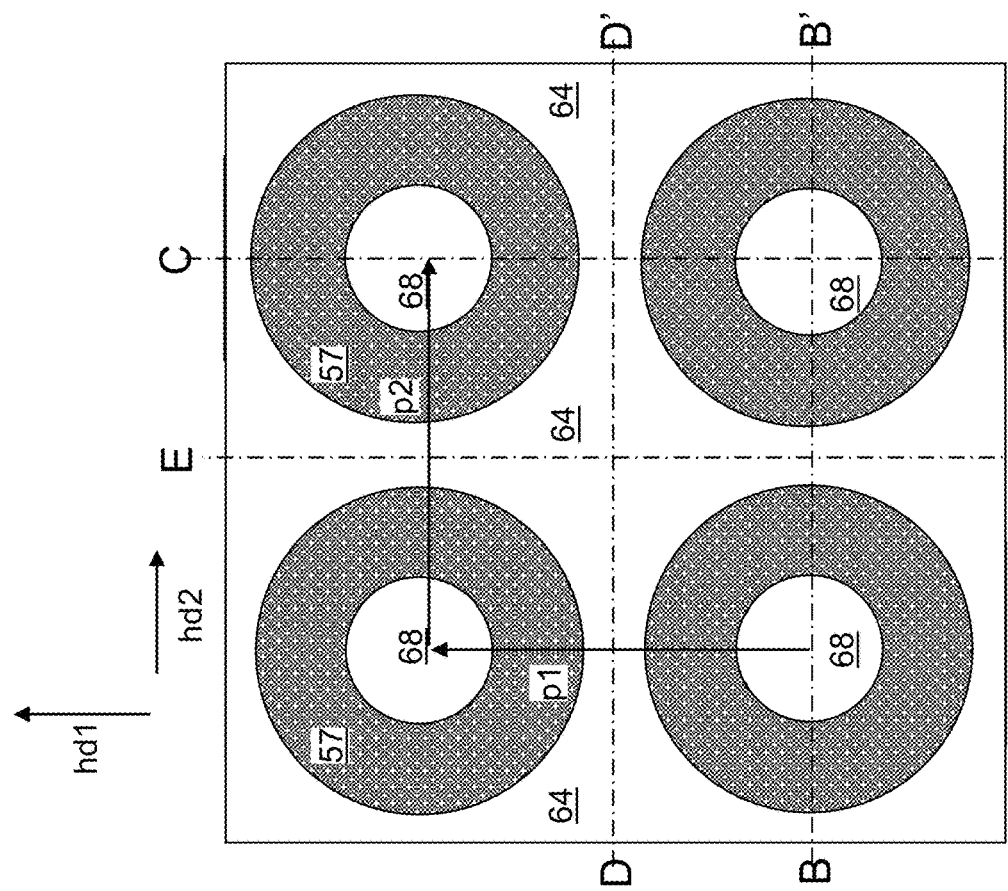

Referring to step 1630 and FIGS. 5A-5C, a two-dimensional array of top electrodes 60 embedded in a top-electrode-level dielectric layer 46L may be formed over the one-dimensional array of inner gate electrodes 42.

Referring to step 1640 and FIGS. 6A-6E, the top-electrode-level dielectric layer 46L and the inner-electrode-level dielectric layer 266L may be patterned with a composite pattern that includes a line pattern and a pattern of the top electrodes 60. Dielectric pillar structures (262, 264, 266, 44, 46) comprising remaining portions of the top-electrode-level dielectric layer 46L and the inner-electrode-level dielectric layer 266L are formed.

Referring to step 1650 and FIGS. 7A-8E, a two-dimensional array of layer stacks may include an active layer 30 and an outer gate dielectric 50 is formed over, and around, two-dimensional array of top electrodes 60.

Referring to step 1660 and FIGS. 9A-15, outer gate electrodes 52 may be formed over a respective row of outer gate dielectrics 50.

Referring to all drawings and according to various embodiments of the present disclosure, a semiconductor structure is provided, which may include: vertical stacks {20, (262, 264, 266, 44, 46), 60} located over a substrate, wherein each of the vertical stacks {20, (262, 264, 266, 44, 46), 60} may include, from bottom to top, a bottom electrode 20, a dielectric pillar structure (262, 262, 264, 266, 44, 46) including a lateral opening therethrough, and a top electrode 60; layer stacks (30, 50) located over the vertical stacks {20, (262, 264, 266, 44, 46), 60}, wherein each of the layer stacks (30, 50) may include an active layer 30 and an outer gate dielectric 50 and laterally surrounds a respective one of the vertical stacks {20, (262, 264, 266, 44, 46), 60}; inner gate electrodes 42 passing through a respective subset of the lateral openings in a respective row of vertical stacks {20, (262, 264, 266, 44, 46), 60} that are arranged along a first horizontal direction hd1; and outer gate electrodes 52 laterally extending along the first horizontal direction hd1 and laterally surrounding a respective row of layer stacks (30, 50).

In one embodiment, first sidewall segments of the top electrode 60 are vertically coincident with (i.e., located within a same vertical plane as) sidewall segments of the dielectric pillar structure (262, 264, 266, 44, 46) within each of the vertical stacks {20, (262, 264, 266, 44, 46), 60}.

Second sidewall segments of the top electrode may contact sidewall segments of the dielectric pillar structure (262, 264, 266, 44, 46) (such as sidewall segments of an upper dielectric pillar portion 46).

In one embodiment, each of the dielectric pillar structures (262, 264, 266, 44, 46) may include: an upper dielectric pillar portion 46 interposed between a respective top electrode 60 and a respective inner gate electrode 42; a pair of middle dielectric pillar portions 266 located adjacent to the respective inner gate electrode 42; and a lower dielectric pillar portion 262 interposed between the respective inner gate electrode 42 and a respective bottom electrode 20. In one embodiment, the upper dielectric pillar portion may include a pair of upper dielectric lateral protrusions (that laterally extend along the second horizontal direction hd2) having top surfaces within a same horizontal plane as a top surface of the respective top electrode 60.

In one embodiment, each of the inner gate electrodes 42 is electrically isolated from a respective row of active layers 30 by a respective inner gate dielectric 40.

In one embodiment, each of the inner gate electrodes 42 comprise an inner gate electrode bottom surface and a pair of inner gate electrode sidewalls; and the respective inner gate dielectric 40 may include a horizontal inner gate dielectric segment contacting the inner gate electrode bottom surface and a pair of vertical inner gate dielectric segments contacting the pair of inner gate electrode sidewalls.

In one embodiment, the upper dielectric pillar portion 46 and the lower dielectric pillar portion 262 may underlie a row of top electrodes 60 that are arranged along the first horizontal direction hd1, and may overlie a row of bottom electrodes 20 that are arranged along the first horizontal direction hd1.

In one embodiment, the vertical stacks {20, (262, 264, 266, 44, 46), 60} are arranged as a periodic two-dimensional array of the vertical stacks {20, (262, 264, 266, 44, 46), 60} having a first pitch p1 along the first horizontal direction hd1 and having a second pitch p2 along a second horizontal direction hd2 that is different from the first horizontal direction hd1; the layer stacks (30, 50) are arranged as a periodic two-dimensional array of the layer stacks (30, 50); the inner gate electrodes 42 are arranged as a one-dimensional array of the inner gate electrodes 42 arranged along the second horizontal direction hd2 with the second pitch p2; and the outer gate electrodes 52 are arranged as a one-dimensional array of the outer gate electrodes 52 arranged along the second horizontal direction hd2 with the second pitch p2.

According to another aspect of the present disclosure, a vertical field effect transistor is provided, which may include: a vertical stack {20, (262, 264, 266, 44, 46), 60} may include, from bottom to top, a bottom electrode 20, a dielectric pillar structure (262, 264, 266, 44, 46) including a lateral opening therethrough, and a top electrode 60; an active layer 30 may include a semiconducting material and laterally surrounding the top electrode 60 and may include a pair of vertically-extending wing portions that overlie sidewalls of the dielectric pillar structure (262, 264, 266, 44, 46) and the bottom electrode 20; an outer gate dielectric 50 overlying sidewalls of the active layer 30; outer gate electrodes 52 laterally surrounding the outer gate dielectric 50; an inner gate electrode 42 passing through the lateral openings through the dielectric pillar structure (262, 264, 266, 44, 46); and an inner gate dielectric 40 contacting sidewalls of the inner gate electrode 42.

In one embodiment, first sidewalls of top electrode 60 are vertically coincident with sidewall segments of the dielectric pillar structure (262, 264, 266, 44, 46); and the dielectric pillar structure (262, 264, 266, 44, 46) contacts second sidewall segments of the top electrode 60.

In one embodiment, the dielectric pillar structure (262, 264, 266, 44, 46) may include: an upper dielectric pillar portion 46 interposed between the top electrode 60 and the inner gate electrode 42; a pair of middle dielectric pillar portions 266 located adjacent to the inner gate electrode 42; and a lower dielectric pillar portion 262 interposed between inner gate electrode 42 and the bottom electrode 20.

In one embodiment, the dielectric pillar structure (262, 264, 266, 44, 46) may include: a central portion located between the pair of vertically-extending wing portions of the outer gate electrode 52 (and having an areal overlap with the top electrode 60 in a plan view such as a top-down view); and a pair of lateral protrusion regions that protrude outward through gaps between the pair of vertically-extending wing portions of the outer gate electrode 52 (and thus, does not have any areal overlap with the top electrode 60 in the plan view).

In one embodiment, the inner gate electrode 42 laterally extends along a first horizontal direction hd1 and has a uniform width along a second horizontal direction hd2 that is invariant under translation along the first horizontal direction hd1.

According to various aspects of the present disclosure, the vertical field effect transistors of the present disclosure provide a dual gate vertical field effect transistor. The dual gate configuration allows a built-in AND operation in which the electrical current between the bottom electrode 20 and the top electrode 60 flows if any one of an inner gate electrode 42 and an outer gate electrode 52 is turned on. Further, the vertical field effect transistors of the present disclosure provide device scaling without use of expensive lithographic patterning tools by enabling vertical device scaling.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    vertical stacks located over a substrate, wherein each of the vertical stacks comprises, from bottom to top, a bottom electrode, a dielectric pillar structure, and a top electrode;
    layer stacks located over the vertical stacks, wherein each of the layer stacks comprises an active layer and an outer gate dielectric and laterally surrounds a respective one of the vertical stacks;
    inner gate electrodes passing through a respective subset of the dielectric pillar structures in a respective row of vertical stacks that are arranged along a first horizontal direction; and outer gate electrodes laterally extending along the first horizontal direction and laterally surrounding a respective row of layer stacks,
wherein each of the inner gate electrodes is electrically isolated from a respective row of active layers by a respective inner gate dielectric.

2. The semiconductor structure of claim 1, wherein each of the outer gate electrodes comprises:
a row of tubular gate electrode regions that laterally surround a respective one of the layer stacks; and
a row of gate electrode stitch regions interlaced with the row of tubular gate electrode regions and contacting upper portions of a respective neighboring pair of tubular gate electrodes within the row of tubular gate electrode regions.

3. The semiconductor structure of claim 2, wherein top surface of the row of tubular gate electrode regions and top surfaces of the row of gate electrode stitch regions are located within a same horizontal plane.

4. The semiconductor structure of claim 2, further comprising a dielectric isolation matrix laterally surrounding each of the tubular gate electrode regions of the outer gate electrodes and comprising recessed surfaces that contact bottom surfaces of the gate electrode stitch regions.

5. The semiconductor structure of claim 1, wherein sidewall segments of the top electrode are vertically coincident with sidewall segments of the dielectric pillar structure within each of the vertical stacks.

6. The semiconductor structure of claim 1, wherein each of the dielectric pillar structures comprises:
an upper dielectric pillar portion interposed between a respective top electrode and a respective inner gate electrode;
a pair of middle dielectric pillar portions located adjacent to the respective inner gate electrode; and
a lower dielectric pillar portion interposed between the respective inner gate electrode and a respective bottom electrode.

7. The semiconductor structure of claim 6, wherein the upper dielectric pillar portion comprises a pair of upper dielectric lateral protrusions having top surfaces within a same horizontal plane as a top surface of the respective top electrode.

8. The semiconductor structure of claim 1, wherein:
each of the inner gate electrodes comprise an inner gate electrode bottom surface and a pair of inner gate electrode sidewalls; and
the respective inner gate dielectric comprises a horizontal inner gate dielectric segment contacting the inner gate electrode bottom surface and a pair of vertical inner gate dielectric segments contacting the pair of inner gate electrode sidewalls.

9. The semiconductor structure of claim 1, wherein:
the vertical stacks are arranged as a periodic two-dimensional array of the vertical stacks having a first pitch along the first horizontal direction and having a second pitch along a second horizontal direction that is different from the first horizontal direction;
the layer stacks are arranged as a periodic two-dimensional array of the layer stacks;
the inner gate electrodes are arranged as a one-dimensional array of the inner gate electrodes arranged along the second horizontal direction with the second pitch; and
the outer gate electrodes are arranged as a one-dimensional array of the outer gate electrodes arranged along the second horizontal direction with the second pitch.

10. A vertical field effect transistor, comprising:
a vertical stack comprising, from bottom to top, a bottom electrode, a dielectric pillar structure, and a top electrode;
an active layer comprising a semiconducting material and laterally surrounding the top electrode and comprising a pair of vertically-extending wing portions that overlie sidewalls of the dielectric pillar structure and the bottom electrode;
an outer gate dielectric overlying sidewalls of the active layer;
outer gate electrodes laterally surrounding the outer gate dielectric;
an inner gate electrode passing through the dielectric pillar structure; and
an inner gate dielectric contacting sidewalls of the inner gate electrode.

11. The vertical field effect transistor of claim 10, wherein:
first sidewalls of top electrode are vertically coincident within sidewall segments of the dielectric pillar structure; and
the dielectric pillar structure contacts second sidewall segments of the top electrode.

12. The vertical field effect transistor of claim 10, wherein the dielectric pillar structure comprises:
an upper dielectric pillar portion interposed between the top electrode and the inner gate electrode;
a pair of middle dielectric pillar portions located adjacent to the inner gate electrode; and
a lower dielectric pillar portion interposed between the inner gate electrode and the bottom electrode.

13. The vertical field effect transistor of claim 10, wherein the dielectric pillar structure comprises:
a central portion located between the pair of vertically-extending wing portions of the outer gate electrode; and
a pair of lateral protrusion regions that protrude outward through gaps between a pair of vertically-extending wing portions of the outer gate electrode.

14. The vertical field effect transistor of claim 10, wherein the inner gate electrode laterally extends along a first horizontal direction and has a uniform width along a second horizontal direction that is invariant under translation along the first horizontal direction.

15. A semiconductor structure comprising:
vertical stacks located over a substrate, wherein each of the vertical stacks comprises, from bottom to top, a bottom electrode, a dielectric pillar structure, and a top electrode;
active layers laterally surrounding a respective one of the vertical stacks;
inner gate electrodes passing through a respective subset of the dielectric pillar structures in a respective row of vertical stacks that are arranged along a first horizontal direction;
outer gate electrodes laterally surrounding a respective row of active layers,
wherein each of the outer gate electrodes comprises a row of tubular gate electrode regions that laterally surround a respective one of the vertical stacks.

16. The semiconductor structure of claim 15, wherein each of the outer gate electrodes further comprises a row of gate electrode stitch regions interlaced with the row of tubular gate electrode regions and contacting upper portions of a respective neighboring pair of tubular gate electrodes within the row of tubular gate electrode regions.

17. The semiconductor structure of claim 15, wherein sidewall segments of the top electrode are vertically coincident with sidewall segments of the dielectric pillar structure within each of the vertical stacks.

18. The semiconductor structure of claim 15, wherein each of the dielectric pillar structures comprises:
   an upper dielectric pillar portion interposed between a respective top electrode and a respective inner gate electrode;
   a pair of middle dielectric pillar portions located adjacent to the respective inner gate electrode; and
   a lower dielectric pillar portion interposed between the respective inner gate electrode and a respective bottom electrode.

19. The semiconductor structure of claim 15, wherein each of the inner gate electrodes is electrically isolated from a respective row of active layers by a respective inner gate dielectric.

20. The semiconductor structure of claim 15, wherein:
   the vertical stacks are arranged as a periodic two-dimensional array of the vertical stacks having a first pitch along the first horizontal direction and having a second pitch along a second horizontal direction that is different from the first horizontal direction;
   the layer stacks are arranged as a periodic two-dimensional array of the layer stacks;
   the inner gate electrodes are arranged as a one-dimensional array of the inner gate electrodes arranged along the second horizontal direction with the second pitch; and
   the outer gate electrodes are arranged as a one-dimensional array of the outer gate electrodes arranged along the second horizontal direction with the second pitch.

* * * * *